United States Patent
Handwerker et al.

(10) Patent No.: US 10,376,997 B2
(45) Date of Patent: Aug. 13, 2019

(54) TRANSIENT LIQUID PHASE BONDING PROCESS AND ASSEMBLIES FORMED THEREBY

(71) Applicant: Purdue Research Foundation, West Lafayette, IN (US)

(72) Inventors: Carol A. Handwerker, West Lafayette, IN (US); John Ryan Holaday, Yorktown, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/631,894

(22) Filed: Jun. 23, 2017

(65) Prior Publication Data

US 2017/0368644 A1 Dec. 28, 2017

Related U.S. Application Data

(60) Provisional application No. 62/353,871, filed on Jun. 23, 2016.

(51) Int. Cl.
*B23K 31/02* (2006.01)
*B23K 35/26* (2006.01)
*B23K 20/16* (2006.01)
*B23K 1/20* (2006.01)
*H01L 23/00* (2006.01)

(52) U.S. Cl.
CPC ............ *B23K 35/264* (2013.01); *B23K 1/203* (2013.01); *B23K 20/16* (2013.01); *H01L 24/00* (2013.01); *H01L 2224/83* (2013.01)

(58) Field of Classification Search
CPC ...... B23K 35/264; B23K 20/16; B23K 1/203; H01L 24/00
See application file for complete search history.

(56) References Cited

U.S. PATENT DOCUMENTS

| | | | | |
|---|---|---|---|---|
| 4,014,660 A | * | 3/1977 | Schreiner | C23C 2/08 228/254 |
| 6,800,169 B2 | * | 10/2004 | Liu | B32B 7/12 156/292 |
| 9,005,330 B2 | | 4/2015 | Shearer et al. | |
| 2003/0019568 A1 | * | 1/2003 | Liu | B32B 7/12 156/245 |
| 2004/0219384 A1 | * | 11/2004 | Cooper | C23C 2/04 428/646 |
| 2007/0152026 A1 | * | 7/2007 | Suh | B23K 35/262 228/193 |
| 2009/0301607 A1 | * | 12/2009 | Nakano | B23K 35/0244 148/24 |

(Continued)

*Primary Examiner* — Kiley S Stoner
(74) *Attorney, Agent, or Firm* — Hartman Global IP Law; Gary M. Hartman; Domenica N. S. Hartman

(57) ABSTRACT

Processes of joining substrates via transient liquid phase bonding (TLPB). The processes include providing an interlayer of a low melting temperature phase (LTP) that includes Sn and Bi between and in contact with at least two substrates, and heating the substrates and the interlayer therebetween at a processing temperature equal to or above 200° C. such that the interlayer liquefies and the LTP interacts with high melting temperature phases (HTPs) of the substrates to yield isothermal solidification of the interlayer. The processing temperature is maintained for a duration sufficient for the interlayer to be completely consumed and a solid bond is formed between the substrates. Also provided are assemblies formed by the above noted processes.

17 Claims, 21 Drawing Sheets

(56) References Cited

U.S. PATENT DOCUMENTS

| | | | |
|---|---|---|---|
| 2010/0252616 A1* | 10/2010 | Shearer | B22F 1/0003 228/248.1 |
| 2011/0132656 A1* | 6/2011 | Horiguchi | B23K 1/0016 174/520 |
| 2011/0220704 A1* | 9/2011 | Liu | B23K 35/0238 228/252 |
| 2011/0268985 A1 | 11/2011 | Zhang et al. | |
| 2013/0008698 A1* | 1/2013 | Himori | H01B 1/22 174/251 |
| 2013/0033827 A1* | 2/2013 | Das | H05K 3/4623 361/752 |
| 2013/0062107 A1* | 3/2013 | Higuchi | H05K 3/4069 174/257 |
| 2013/0270327 A1* | 10/2013 | Yoon | B23K 20/16 228/176 |
| 2014/0002952 A1* | 1/2014 | McConnell | B23K 1/0016 361/301.4 |
| 2014/0042212 A1* | 2/2014 | Shearer | B23K 35/025 228/248.1 |
| 2014/0110153 A1* | 4/2014 | Kashiwagi | B22F 1/0074 174/251 |
| 2014/0361070 A1* | 12/2014 | Cho | B23K 35/264 228/249 |
| 2016/0136761 A1* | 5/2016 | Chen | B23K 35/24 175/428 |
| 2016/0136762 A1* | 5/2016 | Chen | C22C 5/08 228/191 |
| 2016/0368103 A1* | 12/2016 | Shearer | B23K 35/26 |
| 2017/0282287 A1* | 10/2017 | Larsson | B23K 20/02 |
| 2017/0283255 A1* | 10/2017 | Ehmke | B81C 3/001 |
| 2017/0358397 A1* | 12/2017 | McConnell | H01G 4/38 |
| 2018/0036798 A1* | 2/2018 | Washizuka | B23K 35/26 |

* cited by examiner

|  | Processing via Isothermal Hold | | | Melting Temperature after Processing |
| --- | --- | --- | --- | --- |
|  | Initial | Mid-Process | Post-Process | |
| Processing Regime 1 $138°C < T < 200°C$ All compositions | Sn-Bi Liquid | Sn-Bi Liquid | Rejected Bi Phase | Liquid forming reaction between $Cu_6Sn_5$ and rejected Bi phase occurs near 200°C |
| Processing Regime 2 $T > 200°C$ AND Sn-rich composition | Sn-Bi Liquid | Sn-Bi Liquid | Long duration anneal (> 1 hr) required to convert $Cu_6Sn_5$ to $Cu_3Sn$ for isothermal solidification → Rejected Bi Phase | Melting temperature increased to that of Bi (271°C) assuming complete conversion |
| Processing Regime 3 $T > 200°C$ AND Bi-rich composition | Sn-Bi Liquid | Sn-Bi Liquid | Rejected Bi Phase | Melting temperature increased to that of Bi (271°C) |

FIG. 5

TRANSIENT LIQUID PHASE BONDING PROCESS AND ASSEMBLIES FORMED THEREBY

CROSS REFERENCE TO RELATED APPLICATIONS

This application claims the benefit of U.S. Provisional Application No. 62/353,871, filed Jun. 23, 2016, the contents of which are incorporated herein by reference.

STATEMENT REGARDING FEDERALLY SPONSORED RESEARCH

This invention was made with government support under IIP 0649702 awarded by the National Science Foundation. The government has certain rights in the invention.

BACKGROUND OF THE INVENTION

The present invention generally relates to joining and bonding processes. The invention particularly relates to transient liquid phase bonding (TLPB) processes that include a bismuth-rich (Bi-rich) low-melting temperature phase (LTP).

Regulations increasingly prohibit the use of lead-based solders in the electronic interconnection and the electronic packaging industries. Pb-free solders intended to replace traditional eutectic PbSn solders previously investigated include SnAg, SnCu, SnAgCu, and SnZn solders. However, the development of high temperature Pb-free solders to substitute the conventional high lead solders (e.g., Pb-5Sn and Pb-5Sn-2.5Ag) are still in development.

Transient liquid phase bonding (TLPB) is a bonding process that joins substrate materials using an interlayer. On heating to a temperature above the melting point of the interlayer but below the melting point of the substrate materials, the interlayer melts and the interlayer element (or a constituent of an alloy interlayer) diffuses into the substrate materials, causing isothermal solidification. While holding the temperature above the interlayer melting point, interdiffusion and reaction with the substrate materials shifts the composition away from the starting interlayer composition, so solidification occurs at the process temperature to form a bond formed of a different composition (e.g., an intermetallic compound). If sufficient interdiffusion and intermetallic formation occurs, the joint may remain solid and strong well above the original melt process temperature, that is, the result of this process is preferably a bond that has a higher melting point than the bonding temperature. In general, the interlayer is formed of or includes a low melting temperature phase (LTP), such as a Sn or a Sn alloy, that is melted in the presence of a substrate material that is formed of or includes a high melting temperature phase (HTP), such as Ag, Cu, or Ni, such that the LTP is completely consumed by the formation of intermetallic compounds (IMC) upon heating.

While TLPB processes may provide benefits over other existing bonding technologies for certain applications, a so-called drop-in replacement for high Pb containing solder alloys currently used in electronics has not yet been produced. For example, previous investigations considered Cu—Sn—Bi TLPB systems wherein Sn—Bi alloys were isothermally solidified when in contact with Cu substrates. However, these investigations produced solid bonds with limited temperature capabilities, specifically being limited to operating temperatures below about 191° C., at which point the IMCs in the bond form a liquid.

In view of the above, it can be appreciated that there is an ongoing desire for improved systems and methods for replacing Pb-containing solders in the electronic industry that are capable of operating at temperatures comparable to the Pb-containing solders, for example, in excess of 200° C.

BRIEF DESCRIPTION OF THE INVENTION

The present invention provides processes suitable for bonding substrates and assemblies formed thereby that are capable of operating at temperatures in excess of 200° C.

According to one aspect of the invention, a process of joining first and second substrates via transient liquid phase bonding (TLPB) is provided that includes providing an interlayer of a low melting temperature phase (LTP) that includes Sn and Bi between and in contact with the first and second substrates that contain high melting temperature phases (HTPs), and heating the first and second substrates and the interlayer therebetween at a processing temperature equal to or above 200° C. such that the interlayer liquefies and the LTP thereof interacts with the high melting temperature phases (HTPs) of the first and seconds substrates to yield isothermal solidification of the interlayer. The processing temperature is maintained for a duration sufficient for the liquefied interlayer to be completely consumed and a solid bond is formed between the first and second substrates.

According to another aspect of the invention, a process of joining substrates via transient liquid phase bonding (TLPB) is provided that includes providing an interlayer of a low melting temperature phase (LTP) that includes Sn and Bi between and in contact with the substrates that contain high melting temperature phases (HTPs), and heating the substrates and the interlayer therebetween at a processing temperature equal to or above 200° C. such that the interlayer liquefies and the LTP thereof interacts with the HTPs of the substrates to yield isothermal solidification of the interlayer. The HTPs have compositions that include Cu, and the processing temperature is maintained for a duration sufficient for the liquefied interlayer to be completely consumed by intermetallic formation, interdiffusion, and precipitation of Bi and a solid bond is formed between the substrates. The concentration of Bi in the LTP is sufficiently high relative to the processing temperature such that $Cu_6Sn_5$ will not form when heated to or above 200° C.

According to another aspect of the invention, an assembly is provided that includes at least two substrates joined by a solid bond formed of $Cu_3Sn$ and a Bi precipitate that is capable of remaining solid when heated above 200° C. The substrates contain high melting temperature phases (HTPs), and the assembly is formed by a process that includes providing an interlayer of a low melting temperature phase (LTP) that includes Sn and Bi between and in contact with the substrates, and then heating the substrates and the interlayer therebetween at a processing temperature equal to or above 200° C. such that the interlayer liquefies and the LTP interacts with the HTPs of the substrates to yield isothermal solidification of the interlayer. The processing temperature is maintained for a duration sufficient for the interlayer to be completely consumed and the solid bond is formed between the substrates.

Technical effects of the processes described above preferably include the capability of joining substrates with a bond that is Pb-free and capable of operating at temperatures above 200° C., and preferably up to the melting temperature of Bi.

Other aspects and advantages of this invention will be further appreciated from the following detailed description.

BRIEF DESCRIPTION OF THE DRAWINGS

FIG. 5 is a schematic illustration of isothermal solidification of a near eutectic Sn—Bi liquid in contact with Cu at a temperature between 138° C. and 200° C., a Sn-rich Sn—Bi liquid in contact with Cu at a temperature greater than 200° C., and a Bi-rich Sn—Bi liquid in contact with Cu at a temperature greater than 200° C. The layer thicknesses are not to scale.

DETAILED DESCRIPTION OF THE INVENTION

This disclosure provides transient liquid phase bonding (TLPB) processes that form bonds that are lead-free and capable of operating at temperatures above 200° C., preferably up to at least 260° C., and potentially up to the melting point of Bi (e.g., about 271° C.). Specific nonlimiting embodiments include a TLPB system that includes a Bi-rich, Sn—Bi alloy as a low melting temperature phase (LTP). Such Bi-rich LTPs may be used in Sn—Bi—Cu systems in contact with a Cu-containing material, in Sn—Bi—Ni systems in contact with a Ni-containing material, and in Sn—Bi—Ag systems in contact with a Ag-containing. Other suitable substrate materials include mixtures or alloys of Cu, Ni, or Ag, and substrates having certain surface finishes, including electroless Ni/electroless Pd/immersion Au (EN-EPIG), ENIG, Sn and Sn alloys, organic solderability preservative (OSP), and others. Although the LTP is described herein as a Bi-rich composition, it should be understood from the below disclosure that the required minimum concentration of Bi in the LTP is dependent on the processing temperature during the TLPB process. For example, a concentration of at least 54 wt. % Bi is required for processing temperatures between 200 and 300° C. Temperatures above 300° C. may require lower concentrations, potentially even below 50 wt. % Bi. Therefore, the LTP is referred to herein as a Bi-rich composition for convenience only.

Figure 2:
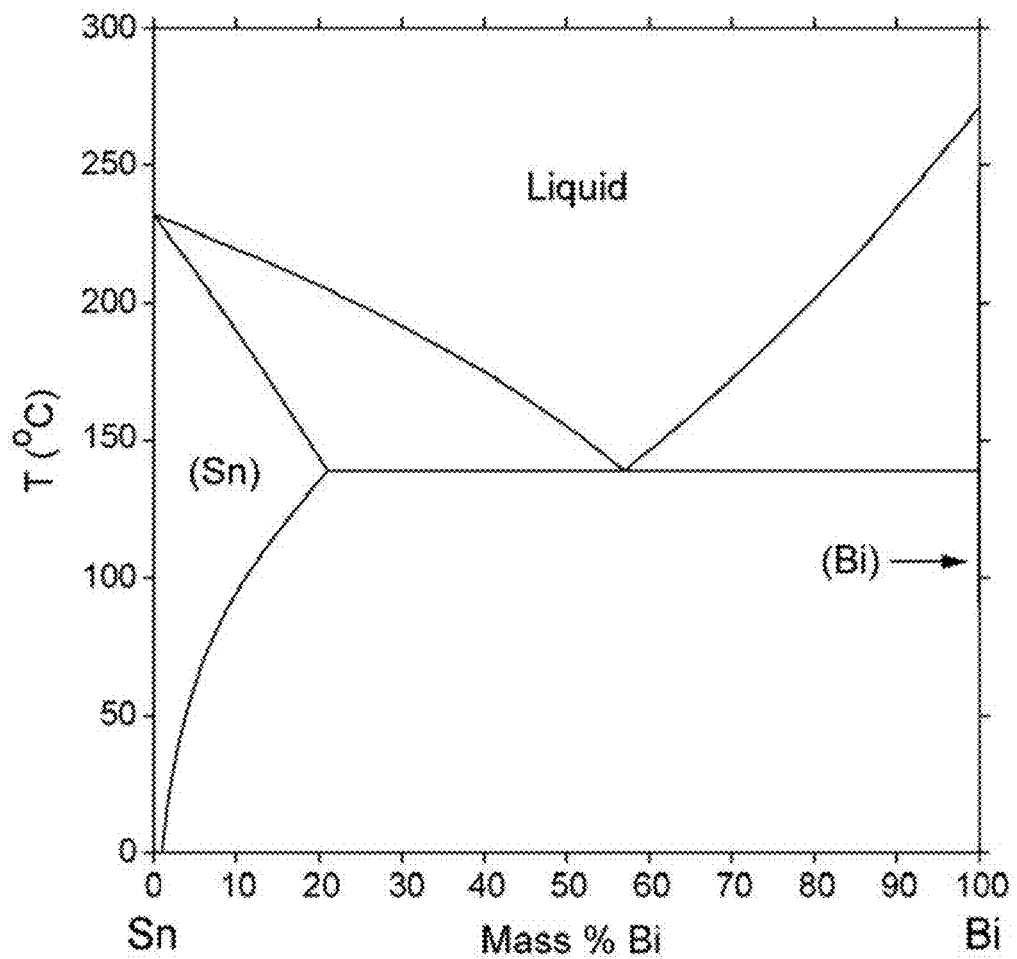
FIGS. 2 through 4 include binary phase diagrams for Bi—Sn, Bi—Cu, and Cu—Sn, respectively.
Figure 3:
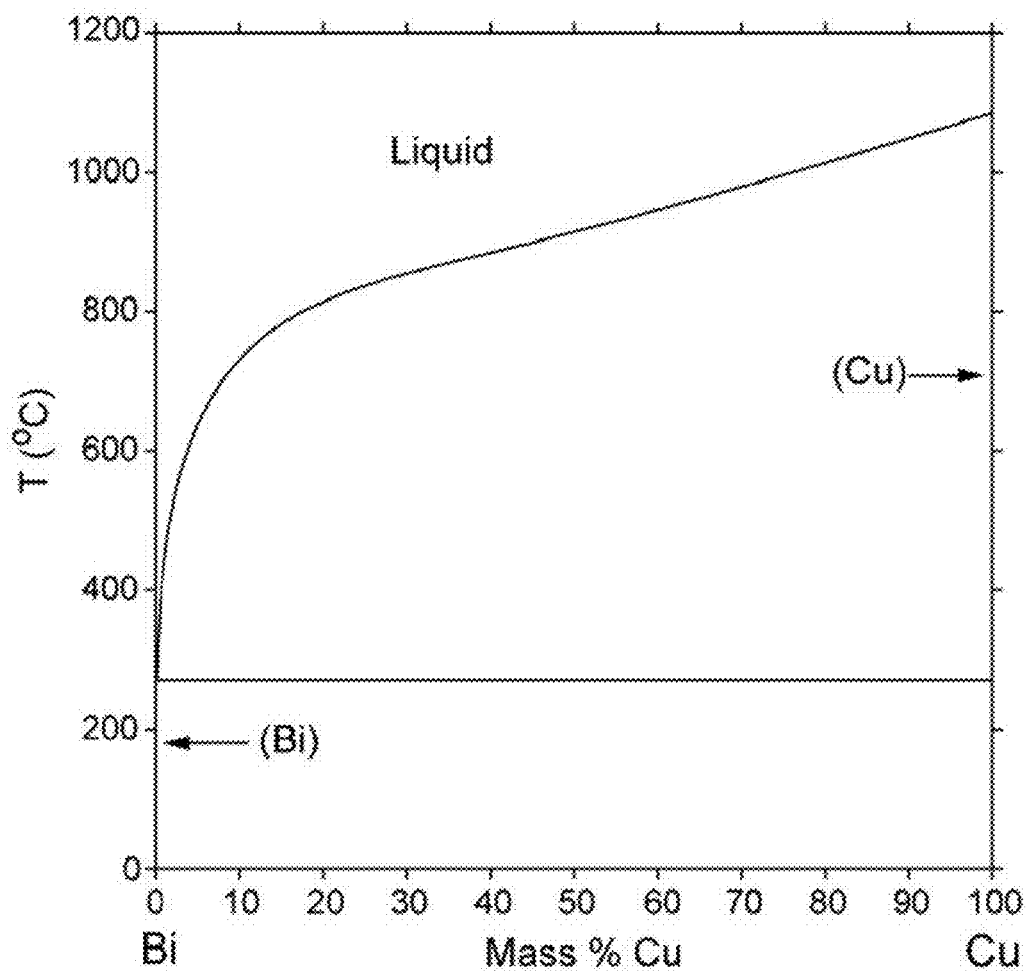
Figure 4:
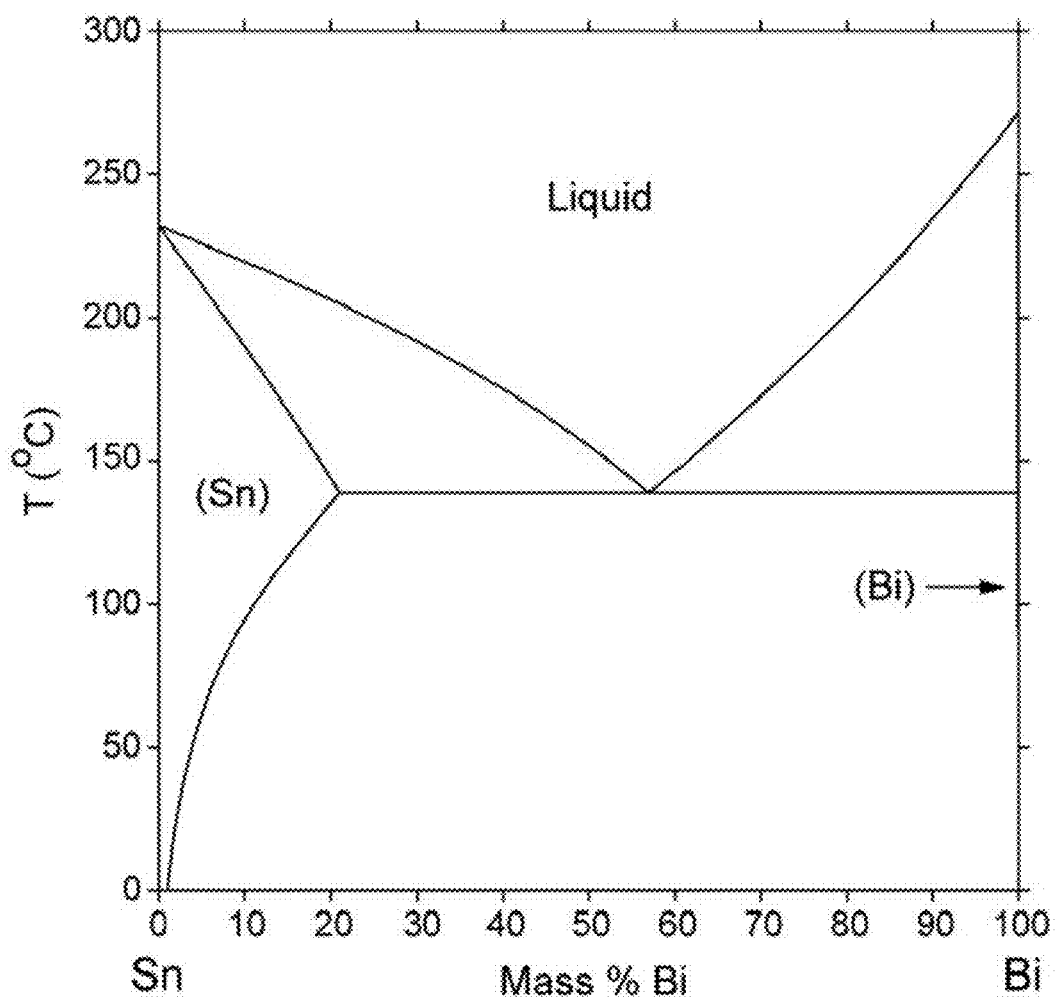

For convenience, the following description will focus on Sn—Bi—Cu systems; however, it should be understood that the teachings of this disclosure are not limited to these specific systems. The phases present in the binary phase diagrams were considered when identifying a suitable system to investigate. FIGS. 2-4 show binary phase diagrams of Bi—Sn, Bi—Cu, and Cu—Sn, respectively. The Sn—Bi diagram illustrates that Sn—Bi is a simple binary eutectic (138° C.) with no IMC phases. The Bi—Cu diagram illustrates that Cu and Bi also do not form any IMC phases. These characteristics make Bi a desirable Sn alloying component for reducing the melting point of a Sn-based LTP without concern for competing Cu—Bi reactions. The Cu—Sn diagram illustrates that several IMC phases form between Cu and Sn. In particular, $Cu_6Sn_5$ and $Cu_3Sn$ form within the processing ranges of interest for TLPB (e.g., greater than about 300° C.). As such, Cu—Sn—Bi systems were established as a potential ternary TLPB system based on the binary data and previous studies, but further investigation of the ternary phase equilibria was needed to understand how such a system would evolve during processing. Therefore, various investigations were conducted in order to evaluate Cu—Sn—Bi systems for use in TLPB processes.

Investigations leading to the present disclosure determined that conventional Cu—Sn—Bi TLPB processes wherein Sn—Bi alloys were isothermally solidified when in contact with Cu substrates resulted in a $Cu_6Sn_5$ intermetallic phase. This $Cu_6Sn_5$ phase reacts with Bi at temperatures above 191° C. to form a liquid, thus limiting the usefulness of the resulting bond for electronics. In contrast, the processes disclosed herein are capable of achieving complete isothermal solidification without the formation of the $Cu_6Sn_5$ phase. As such, the resulting intermetallic compounds (IMC) demonstrated an increase in the operating temperature of the resulting bonds relative to bonds formed with conventional Cu—Sn—Bi TLPB processes, in particular remaining solid and stable at temperatures greater than 200° C.

Figure 1:
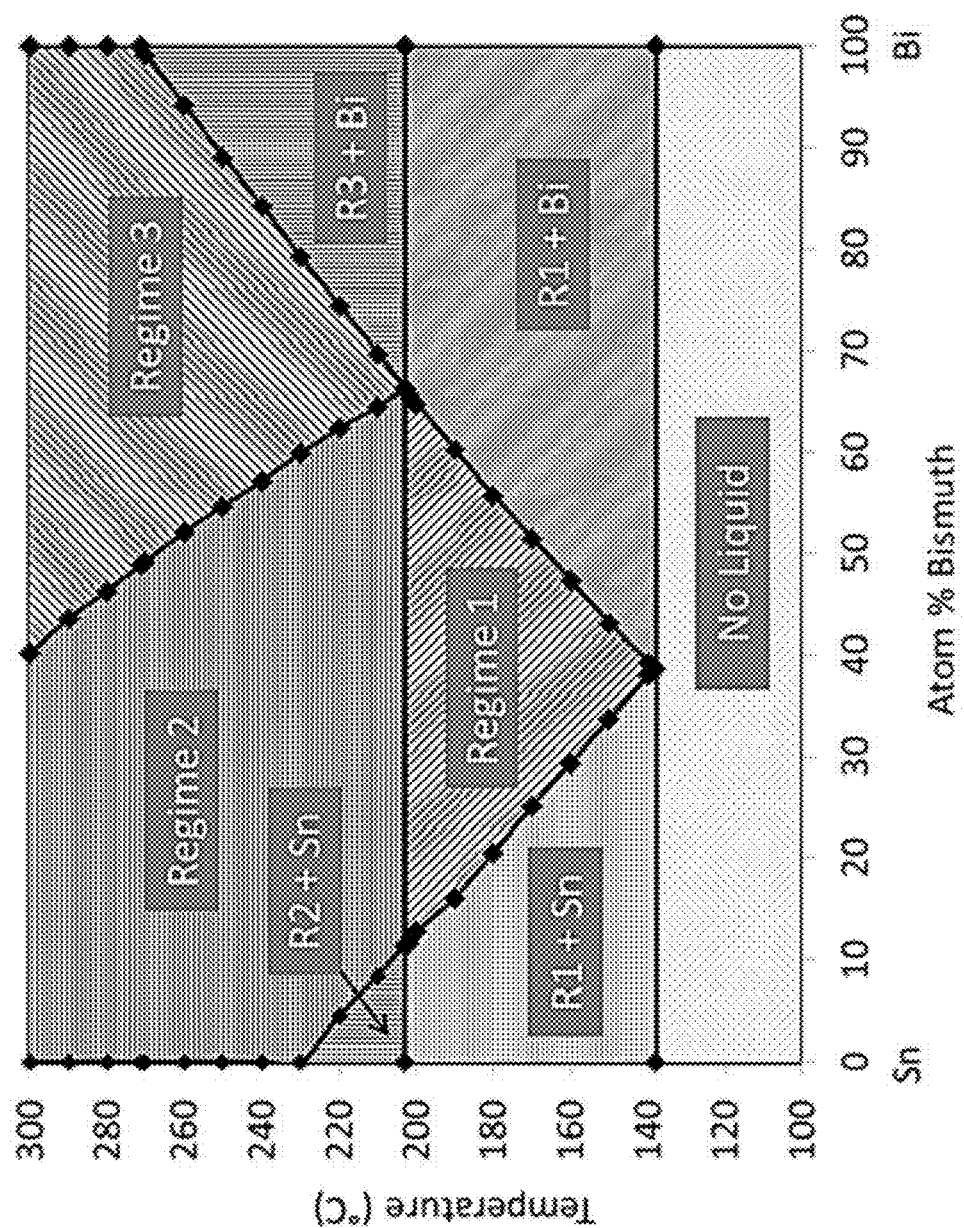
FIG. 1 is a diagram of a processing chart identifying LTP compositions and processing temperatures associated with each processing regime based on CALPHAD phase equilibria in the Cu—Sn—Bi system.

FIG. 1 is a diagram of a processing chart identifying LTP compositions (in atomic percent) and processing temperatures associated with various regimes based on predicted phase equilibria in the Cu—Sn—Bi system. Three specific processing regimes are disclosed, labeled Regimes 1, 2, and 3. Sn—Bi alloy compositions and processing temperatures that fall within Regimes 1 or 2 produce the $Cu_6Sn_5$ phase, whereas alloy compositions and processing temperatures that fall within Regime 3 do not produce the $Cu_6Sn_5$ phase.

Figure 8:
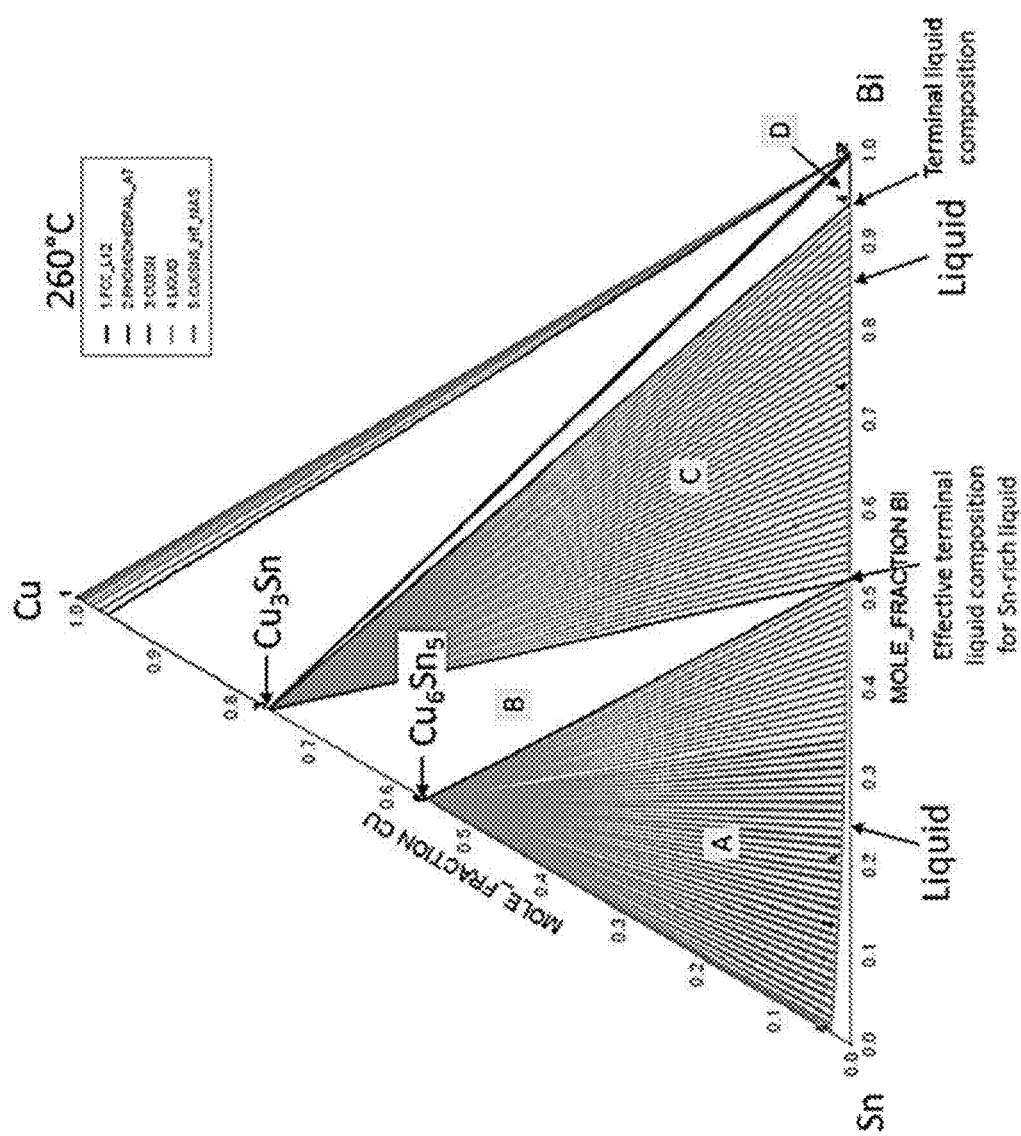

Regime 3 (as well as the Regime labeled R3+Bi) covers Bi-rich compositions at temperatures above approximately 200° C. An example of the reaction in Regime 3 is shown in FIG. 8 which shows that Bi-rich compositions are in two-phase equilibrium with $Cu_3Sn$ as opposed to $Cu_6Sn_5$ (Region "C" in FIG. 8). A $Cu_3Sn$ layer is predicted to form at the interface between a Bi-rich liquid (greater than 65 wt. % Bi at 260° C.) and Cu. Growth of the $Cu_3Sn$ layer will selectively consume Sn causing the liquid to become enriched with Bi. Eventually, a terminal liquid composition is reached as annotated in FIG. 8. This composition is in three-phase equilibrium with solid Bi and $Cu_3Sn$ (Region "D" in FIG. 8). Further growth of the $Cu_3Sn$ layer requires precipitation of a solid Bi phase. The liquid composition must remain constant as the proportion of solid Bi and $Cu_3Sn$ continues to increase until all of the liquid phase has been eliminated. These predicted structures and their melting behavior were verified with differential scanning calorimetry experiments and microstructure evaluation after reaction and have, thus, determined that the use of LTP starting with compositions in Regime 3 may be suitable replacements for high-Pb solder in electronics.

The above noted processing regimes were identified in part using a modeling method referred to as CALPHAD (CALculation of PHAse Diagrams). CALPHAD is a method for representing thermodynamic data mathematically such that phase diagrams may be computed on demand. The values used in a CALPHAD model of a thermodynamic system must be critically assessed to ensure that results match known, experimental equilibrium conditions. Isothermal sections of the Cu—Sn—Bi phase diagrams disclosed herein were produced using a CALPHAD software tool and a thermodynamic database for solder applications commercially available under the name Thermo-Calc™. The behavior of a given system tends to result in similar behavior over certain temperature and LTP composition ranges. However, the exact compositions vary with temperatures; therefore, these ranges are referred to herein as processing regimes.

Several assumptions were used to predict the TLPB behavior in the Cu—Sn—Bi ternary phase diagrams. TLPB is inherently a non-equilibrium process. Realistic isothermal hold times are preferably less than one hour for commercial adoption. Equilibrium phases for the overall composition of the intended TLPB components must be solid phases. That means that the high temperature phase component must be provided in excess to ensure complete solidification. The liquid is assumed to be well mixed, and dissolution of the HTP into the LTP occurs fast enough that it can be assumed to be instantaneous. The interfaces that form at each layer between the HTP and LTP are assumed to be in local equilibrium with adjacent layers. As an example, a solid phase will not precipitate at a given temperature if it is not in contact with a liquid that is in equilibrium with that solid. Interdiffusion controls the rate of evolution of a TLPB structure. These assumptions were used in conjunction with ternary isothermal sections to predict how a Cu—Sn—Bi TLPB structure evolves.

Figure 6:
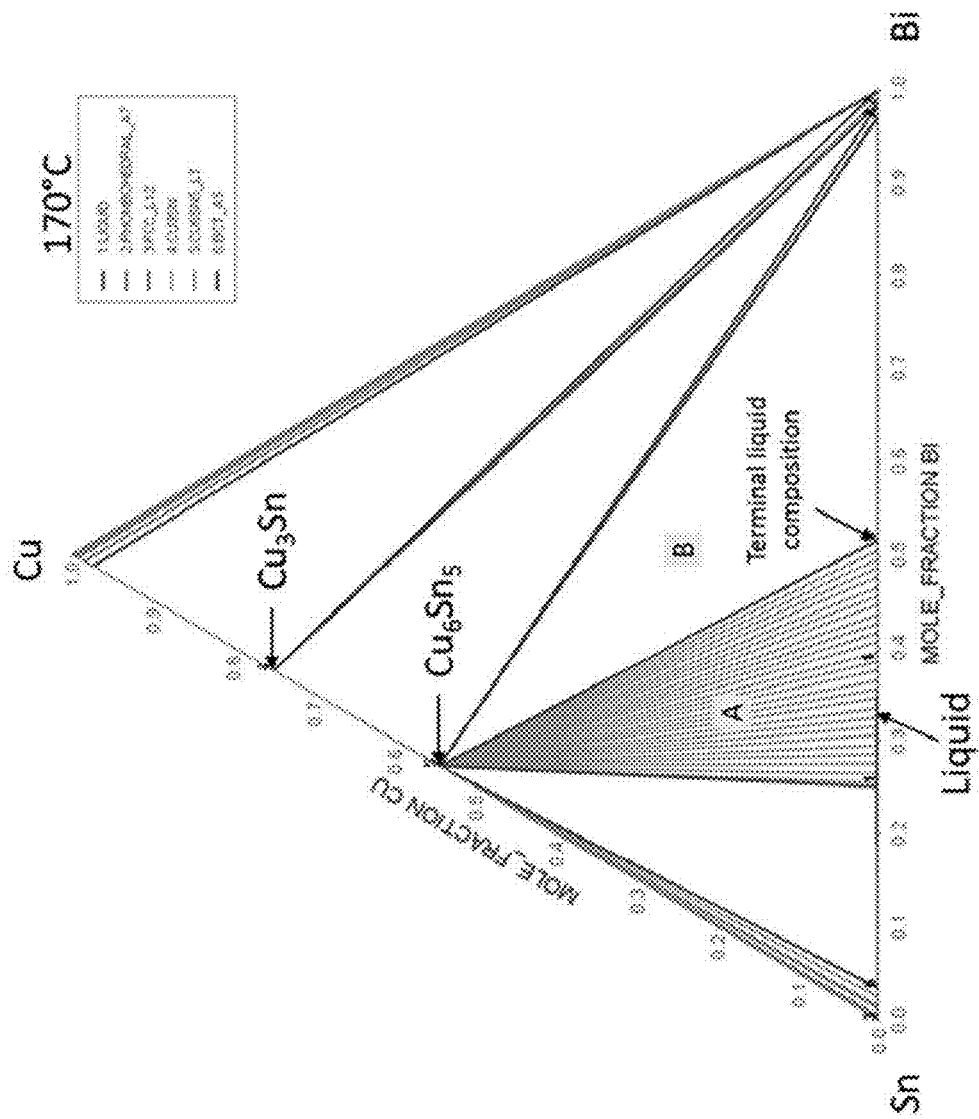
FIGS. 6, 7, and 8 are ternary phase diagrams of Cu—Sn—Bi at 170° C., 210° C., and 260° C., respectively.

As shown in FIG. 1, Regime 1 includes the temperature ranges from the Sn—Bi eutectic reaction temperature, 138° C., up to a transition in equilibrium phases that occurs near 200° C. in the Cu—Sn—Bi system. FIG. 5 includes a schematic illustration of isothermal solidification of a near eutectic Sn—Bi liquid in contact with Cu at a temperature between 138° C. and 200° C. (row "Processing Regime 1"). The initial composition of the components includes the solid Cu and liquid Sn—Bi alloy. A ternary phase diagram of Cu—Sn—Bi at 170° C. represented in FIG. 6 can be used to explain the solidification of this near eutectic Sn—Bi liquid. As represented, the Cu saturated, liquid Sn—Bi LTP is in 2-phase equilibrium with $Cu_6Sn_5$ (Region "A" in FIG. 6). $Cu_3Sn$ is in 2-phase equilibrium with both Cu and $Cu_6Sn_5$. Based on these conditions, a $Cu_6Sn_5$ layer is predicted to form adjacent to the Sn—Bi liquid, and a $Cu_3Sn$ layer is predicted to form between the Cu substrate and the $Cu_6Sn_5$ layer, as represented in FIG. 5 ("Mid-Process"). This structure allows all interfaces to satisfy local equilibrium requirements. Since the $Cu_6Sn_5$ and $Cu_3Sn$ layers incorporate only Sn from the liquid phase, the liquid will become more enriched with rejected Bi solute as the intermetallic layers continue to grow. Eventually, the liquid will reach a maximum Bi concentration which may be referred to as a terminal liquid composition. This terminal liquid composition is in 3-phase equilibrium with $Cu_6Sn_5$ and a solid Bi phase (Region "B" in FIG. 6). Further growth of the $Cu_6Sn_5$ layer cannot proceed without the precipitation of a rejected Bi phase. The proportion of $Cu_6Sn_5$ and the rejected Bi phase increase at the expense of the liquid phase until all of the liquid is consumed as illustrated in FIG. 5 ("Post-Process"). According to these predictions, complete isothermal solidification of a Cu—Sn—Bi TLPB bond is achievable within the 138-200° C. processing regime, but the interface between the rejected Bi phase and $Cu_6Sn_5$ limits maximum operating temperature due to the formation of a liquid as indicated in FIG. 5. The reason this liquid forms is related to change in phase equilibria near 200° C.

Since the Sn—Bi binary is a simple eutectic system, isothermal sections of the Cu—Sn—Bi phase diagram at increasing temperatures exhibit wider ranges of Sn—Bi composition forming liquid. For the processing Regime 1 (138 to 200° C.), the entire range of Sn—Bi compositions are in equilibrium with $Cu_6Sn_5$. Above approximately 200° C., Sn-rich compositions remain in equilibrium with $Cu_6Sn_5$ however Bi-rich compositions are in equilibrium with $Cu_3Sn$ instead. Thus, additional processing regimes are constrained by both temperature and liquid composition.

Regime 2 includes Sn-rich compositions above 200° C. The Cu—Sn—Bi isothermal section at 260° C. in FIG. 8 shows that Sn—Bi liquids composed of up to about 65 wt. % Bi are in 2-phase equilibrium with $Cu_6Sn_5$ (Region "A" in FIG. 8). FIG. 5 schematically illustrates a reaction for processing in Regime 2 (row "Processing Regime 2"). As represented, isothermal processing within this temperature and composition regime is predicted to initially proceed in the same manner as the 138-200° C. processing regime (Regime 1). A $Cu_6Sn_5$ layer and a subsequent $Cu_3Sn$ layer is predicted to form as depicted in FIG. 5 ("Mid-Process"). Intermetallic growth leads to increasing Bi concentration as Sn is selectively consumed from the liquid. Eventually, the liquid reaches approximately 65 wt. % Bi (approximately 51 atomic %) which is in three-phase equilibrium with $Cu_6Sn_5$ and $Cu_3Sn$ (Region "B" in FIG. 8). Additional $Cu_6Sn_5$ cannot form once this liquid composition is reached since liquid compositions above 65 wt. % Bi are in two-phase equilibrium with $Cu_3Sn$ (Region "C" in FIG. 8). The presence of $Cu_6Sn_5$ thus pins the liquid composition. Further liquid consumption is only possible if all of the $Cu_6Sn_5$ is consumed by $Cu_3Sn$ growth; however, the kinetics of $Cu_6Sn_5$ to $Cu_3Sn$ makes such a conversion impractical for processing times of less than one hour. Above 200° C., the liquid composition in three-phase equilibrium (region "B" in FIG. 8) with $Cu_6Sn_5$ and $Cu_3Sn$ is the effective terminal liquid composition. Note that the nominal composition will vary with temperature. At 260° C., the Sn—Bi liquid composed of approximately 65 wt. % Bi is the effective terminal liquid composition as annotated in FIG. 8. Therefore, isothermal solidification of Sn-rich liquid compositions above 200° C. is possible, but generally too slow for commercial TLPB applications because it requires the $Cu_6Sn_5$ to completely transform by diffusion into $Cu_3Sn$ before the liquid can be removed, as depicted in FIG. 5 ("Post-Process").

FIG. 5 schematically illustrates a reaction for processing in Regime 3 (row "Processing in Regime 3"). Regime 3 includes Bi-rich compositions at temperatures above approximately 200° C. The Cu—Sn—Bi isothermal section at 260° C. in FIG. 8 shows that Bi-rich compositions are in two-phase equilibrium with $Cu_3Sn$ as opposed to $Cu_6Sn_5$ (Region "C" in FIG. 8). Therefore, a $Cu_3Sn$ layer is predicted to form at the interface between a Bi-rich liquid (greater than 65 wt. % Bi at 260° C.) and Cu (FIG. 5; "Mid-Process"). Growth of the $Cu_3Sn$ layer will selectively consume Sn causing the liquid to become enriched with Bi. Eventually, a terminal liquid composition is reached as annotated in FIG. 8. This composition is in three-phase equilibrium with solid Bi and $Cu_3Sn$ (Region "D" in FIG. 8). Further growth of the $Cu_3Sn$ layer requires precipitation of a solid Bi phase. The liquid composition must remain constant as the proportion of solid Bi and $Cu_3Sn$ continues to increase until all of the liquid phase has been eliminated (FIG. 5; "Post-Process"). It is possible that a small amount of $Cu_6Sn_5$ may form upon heating the up to 191° C. but such phase will melt when the temperature increases above 200° C. during processing and therefore will not be present in the resulting solid bond.

Figure 7:
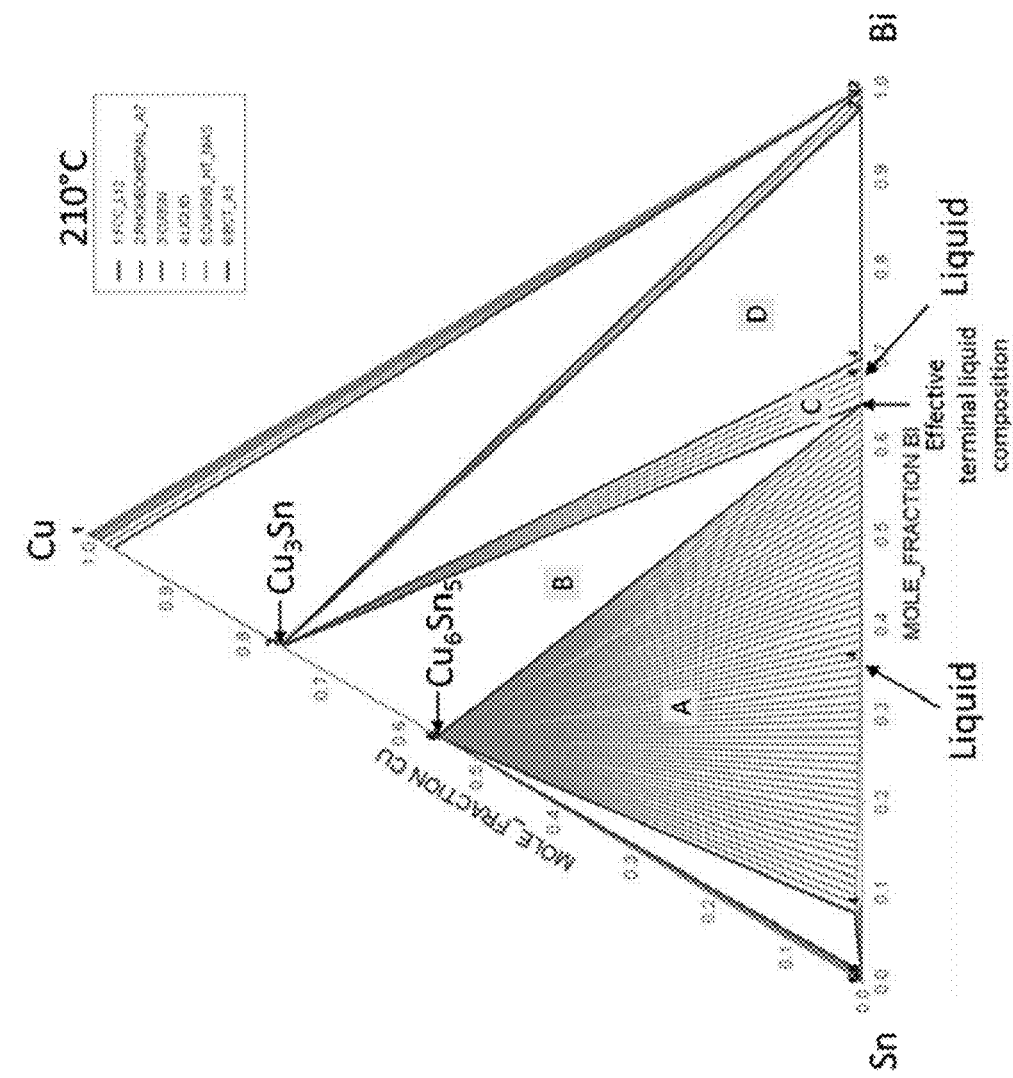

As indicated in FIG. 5, a liquid forms between $Cu_6Sn_5$ and solid Bi when heated above approximately 191° C. As represented in the ternary phase diagram of Cu—Sn—Bi at 210° C. in FIG. 7, the Bi-rich compositions are in equilibrium with $Cu_3Sn$. Therefore, a liquid must form to satisfy local equilibrium requirements since the rejected Bi phase in contact with $Cu_6Sn_5$ violates the phase equilibria above the identified transition. Preferably, the solidus temperature of the TLPB bond would be elevated by isothermal solidification to that of the rejected Bi phase.

The above predictions and assumptions indicated that the issue of $Cu_6Sn_5$ reacting with Bi to form liquid may be circumvented in two ways. Since equilibrium for the overall composition of a TLPB bond is three-phase equilibrium between Bi, $Cu_3Sn$, and Cu, a long term anneal could be used such that all of the $Cu_6Sn_5$ is consumed by $Cu_3Sn$ formation (Regime 2). The alternative is to use a Bi-rich LTP at temperatures above 200° C. such that $Cu_3Sn$ forms directly (Regime 3). Several experiments were performed to validate this interpretation of the Cu—Sn—Bi system. Specifically, the formation of $Cu_3Sn$ without the formation of $Cu_6Sn_5$ at the interface between a Bi-rich Sn—Bi liquid and a solid Cu was tested.

Nonlimiting embodiments of the invention will now be described in reference to experimental investigations leading up to the invention.

A Sn—Bi alloy composed of 80 wt. % Bi was fabricated by melting Sn and Bi shot together in a ceramic crucible on a hotplate set at 500° C. Sufficient rosin flux was added to the crucible to immerse the metal. The molten alloy was poured onto a room temperature copper sheet coated with boron nitride. A portion of the alloy was mounted in low curing temperature epoxy and polished to verify the composition of the resulting alloy using energy-dispersive X-ray spectroscopy (EDS). The solidus and liquidus temperatures were verified using differential scanning calorimetry (DSC). The DSC sample was heated from 0° C. to 400° C. at 20° C. per minute and cooled at 10° C. per minute.

Copper substrates were prepared using phosphoric acid (one part acid to one part reverse osmosis purified (RO) water) for ten minutes followed by rinsing in RO water, acetone, and ethanol sequentially. Finally, a proprietary (Indium Corporation) flux was applied. The Cu substrates used were 5.6 by 5.6 mm Cu pads for a quad flat no-leads (QFN) package.

Based on the methodology disclosed herein, a Sn80 wt. % Bi alloy was anticipated to react with copper to form $Cu_3Sn$ as opposed to $Cu_6Sn_5$. The proposed methodology was assessed by creating solid Cu-liquid Sn—Bi diffusion couples. Three copper substrates were placed in a ceramic boat with a portion of the Sn80 wt. % Bi alloy located on top of each substrate. Excessive liquid was used to prevent the composition of the liquid from changing appreciably. The samples were then heated in a tube furnace at 260° C. for 60 minutes in nitrogen (>130 SCCM) to prevent oxidation. After isothermal treatment, the samples were air cooled. The resulting couples were cross-sectioned using a diamond saw and mounted in low curing temperature epoxy for analysis. Standard metallographic polishing techniques were used to prepare the sample for SEM imaging. Several SEM micrographs were collected at the interface between the Cu substrate and the Sn—Bi alloy. EDS was used to identify the IMC phases present at the interface. Additional sets of Cu—Sn80 wt. % Bi diffusion couples were fabricated in order to gather preliminary intermetallic growth rate measurements.

Figure 9:
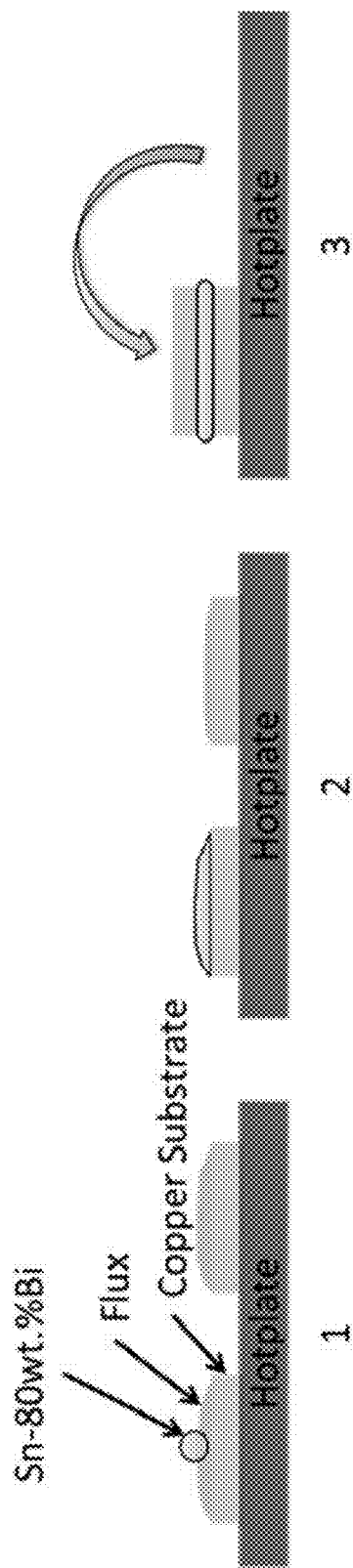
FIG. 9 is a schematic illustration of a procedure used to fabricate TLPB test assemblies.

Referring to FIG. 9, Cu—(Sn—Bi)—Cu assemblies were fabricated using the same substrates and alloy as above. A hotplate was used to pre-solder the assemblies. Fluxed Cu substrates were heated on a hotplate set to 350° C. On one of the substrates, a small sphere of Sn80 wt. % Bi was melted. The second heated, fluxed substrate was then flipped onto the molten Sn80 wt. % Bi. Capillary forces pulled the two substrates together. The resulting assemblies were air cooled.

Figure 10:
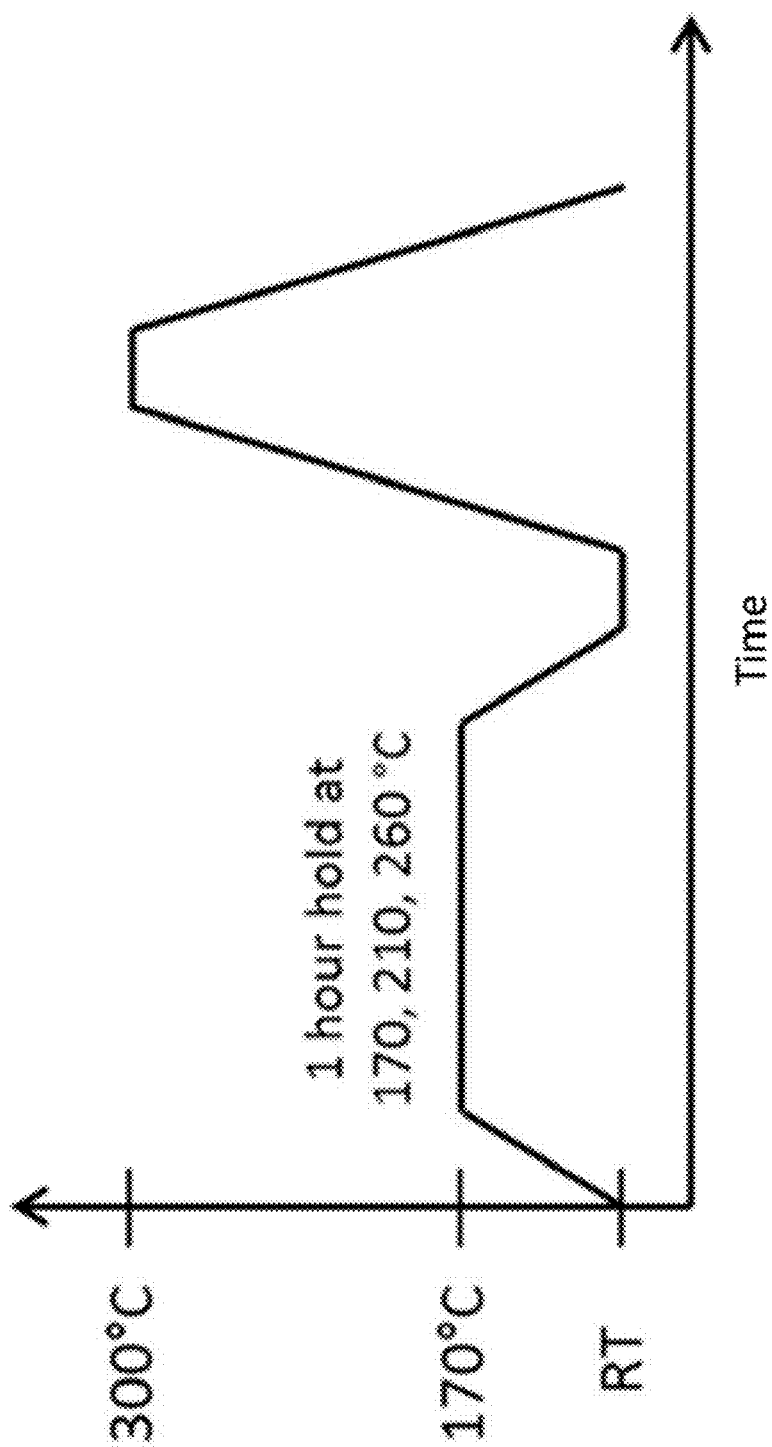
FIG. 10 is a schematic plot of a time temperature profile utilized in DSC to evaluate isothermal solidification of Cu—Sn80 wt. % Bi—Cu assemblies.

Four such assemblies were isothermally treated in a box furnace in regular air atmosphere at 260° C. for one hour. The assemblies were placed between preheated ceramic substrates in the box furnace. Three additional pre-soldered assemblies were trimmed to fit inside DSC pans. Three different DSC temperature profiles were implemented to evaluate whether isothermal solidification would occur according to the proposed interpretation of thermodynamic data for the Cu—Sn—Bi system. The DSC samples were heated in the DSC at a rate of 20° C./min from 0° C. to 170° C. (FIG. 10), 210° C., and 260° C., respectively; held at peak temperature for one hour; and cooled back to room temperature at 10° C./min. All three were subsequently heated to 300° C. at 20° C./min and cooled back to room temperature at 10° C. The 170° C. assembly was expected to exhibit melting peaks near 191° C. The 210 and 260° C. assemblies were predicted to exhibit melting between 250 and 271° C. (i.e., the melting point of Bi).

Figure 11:
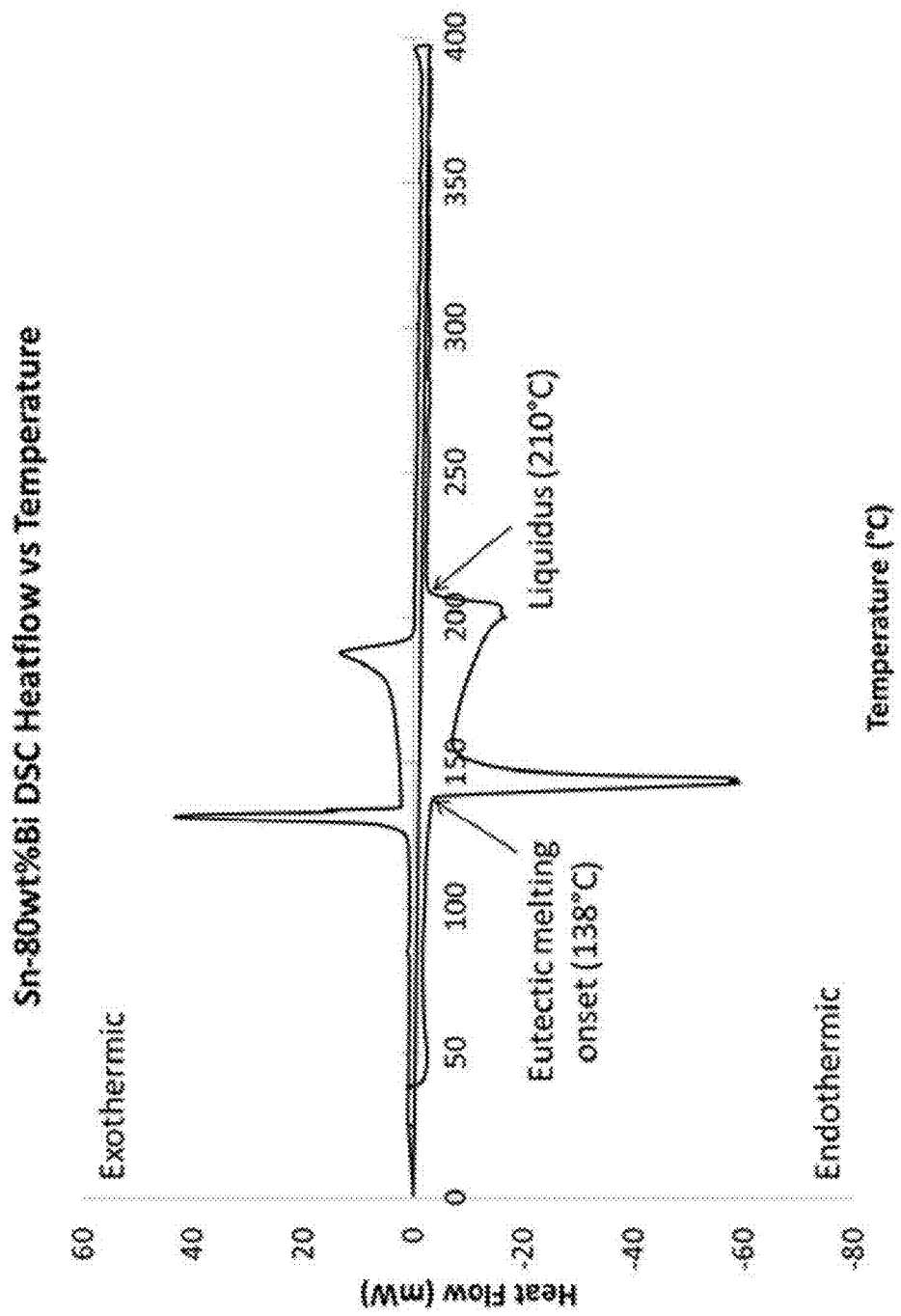
FIG. 11 is a DSC heat flow as a function of temperature for a portion of the Sn80 wt. % Bi alloy alone, as fabricated to evaluate a high Bi content Sn—Bi liquid in contact with Cu.

The DSC plot of thermal flux versus temperature in FIG. 11 shows the liquidus temperature was 210° C. and the solidus temperature of the as-solidified alloy was 138° C. The liquidus temperature corresponds to a composition of approximately 70 at. % Bi which confirms the nominal composition of 80 wt. % Bi (70 at. % Bi). The composition of the alloy was 70 wt. % Bi based on EDS measurements. The difference is likely attributable to error in the ZAF calibration for Sn and Bi signals. Based on these results, the composition of the alloy was confirmed to be within ten percent of the nominal target composition. The ternary phase diagrams at 260° C. in FIG. 8 shows that a 70 wt. % Bi liquid would be acceptable for the purposes of these experiments since that composition is also in equilibrium with $Cu_3Sn$.

Figure 12:
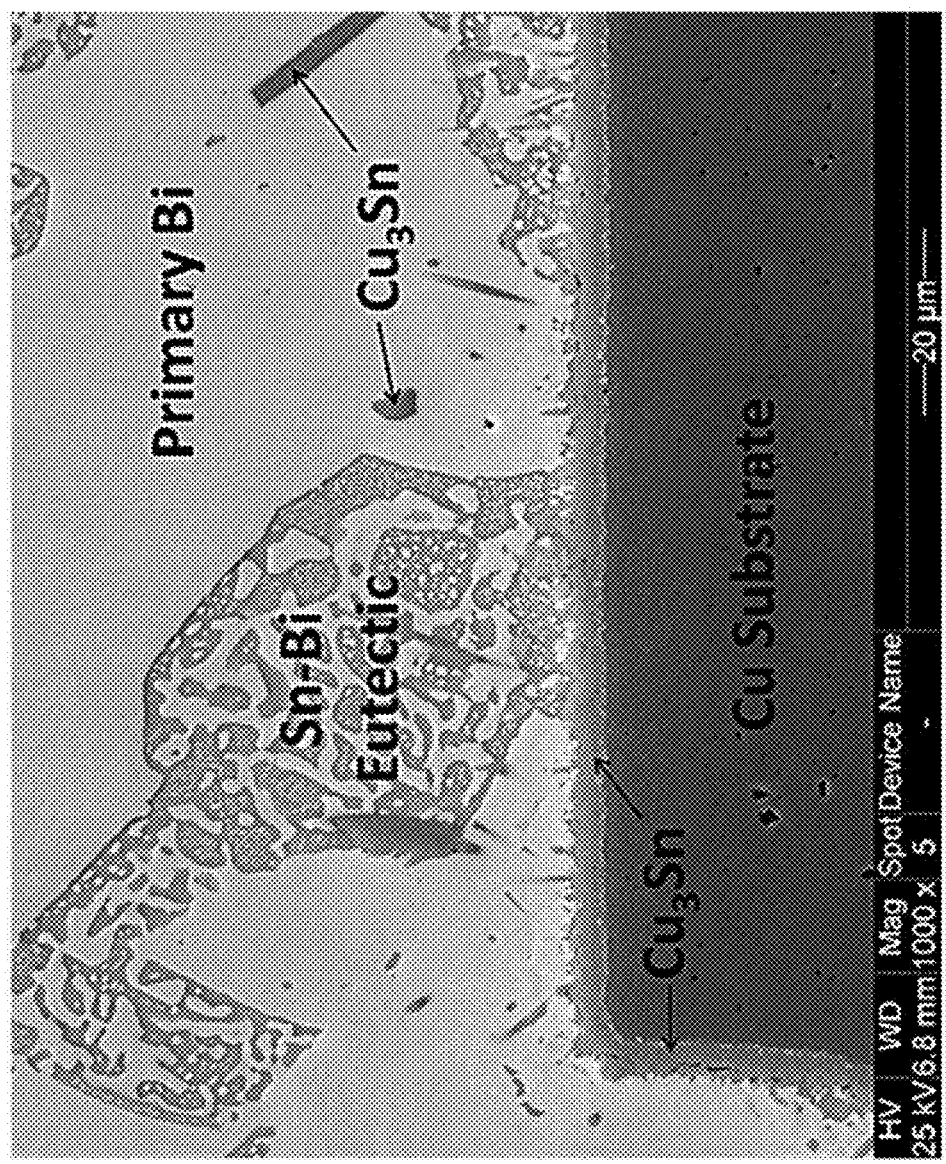
FIG. 12 is a SEM micrograph of a cross-section of a Cu substrate in contact with Sn80 wt % Bi at 260° C. for 1 hour.

The Cu substrates isothermally held in contact with an effectively infinite source of Sn80 wt. % Bi liquid at 260° C. for one hour resulted in the formation of $Cu_3Sn$ at the interface. The annotated SEM micrograph in FIG. 12 shows that a layer of $Cu_3Sn$ formed between the Cu substrate and liquid Sn80 wt. % Bi. Note the $Cu_3Sn$ formed both a consistent layer along with very large crystals protruding out into the solidified liquid region. The cause of these unusually large $Cu_3Sn$ crystals may be attributable to additional $Cu_3Sn$ formation during solidification.

Figure 13:
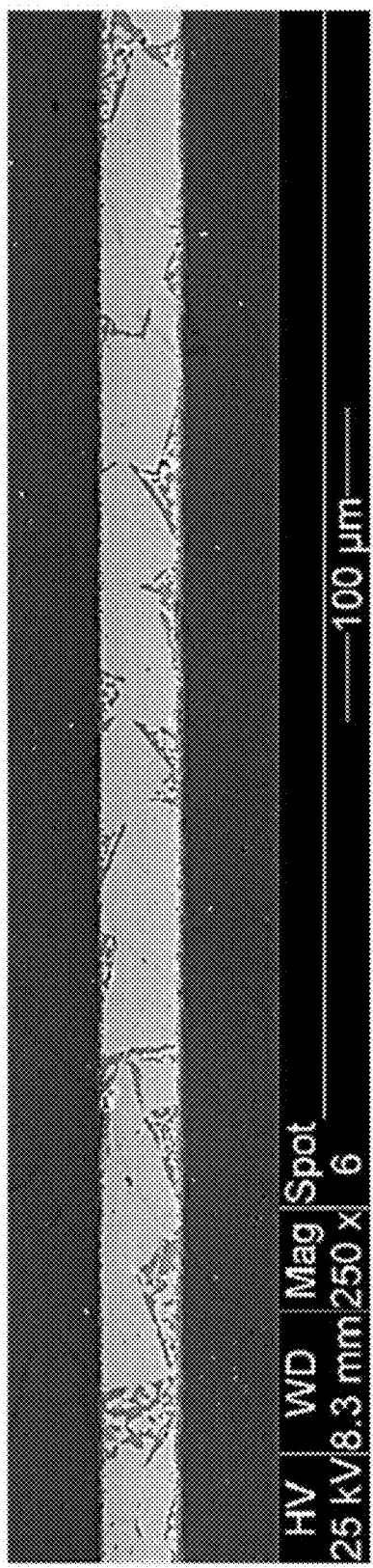
FIG. 13 is a SEM micrograph of an as-fabricated Cu—Sn80 wt. % Bi—Cu assembly that indicates adequate wetting and minimal formation of IMC's during assembly.

Referring to FIG. 13, cross-sections of Cu—Sn80 wt. % Bi—Cu assemblies revealed adequate wetting and minimal formation of intermetallic phases during assembly. Large Bi phases with a Sn—Bi eutectic were observed which is consistent with the Bi-rich composition of the LTP.

Figure 14:
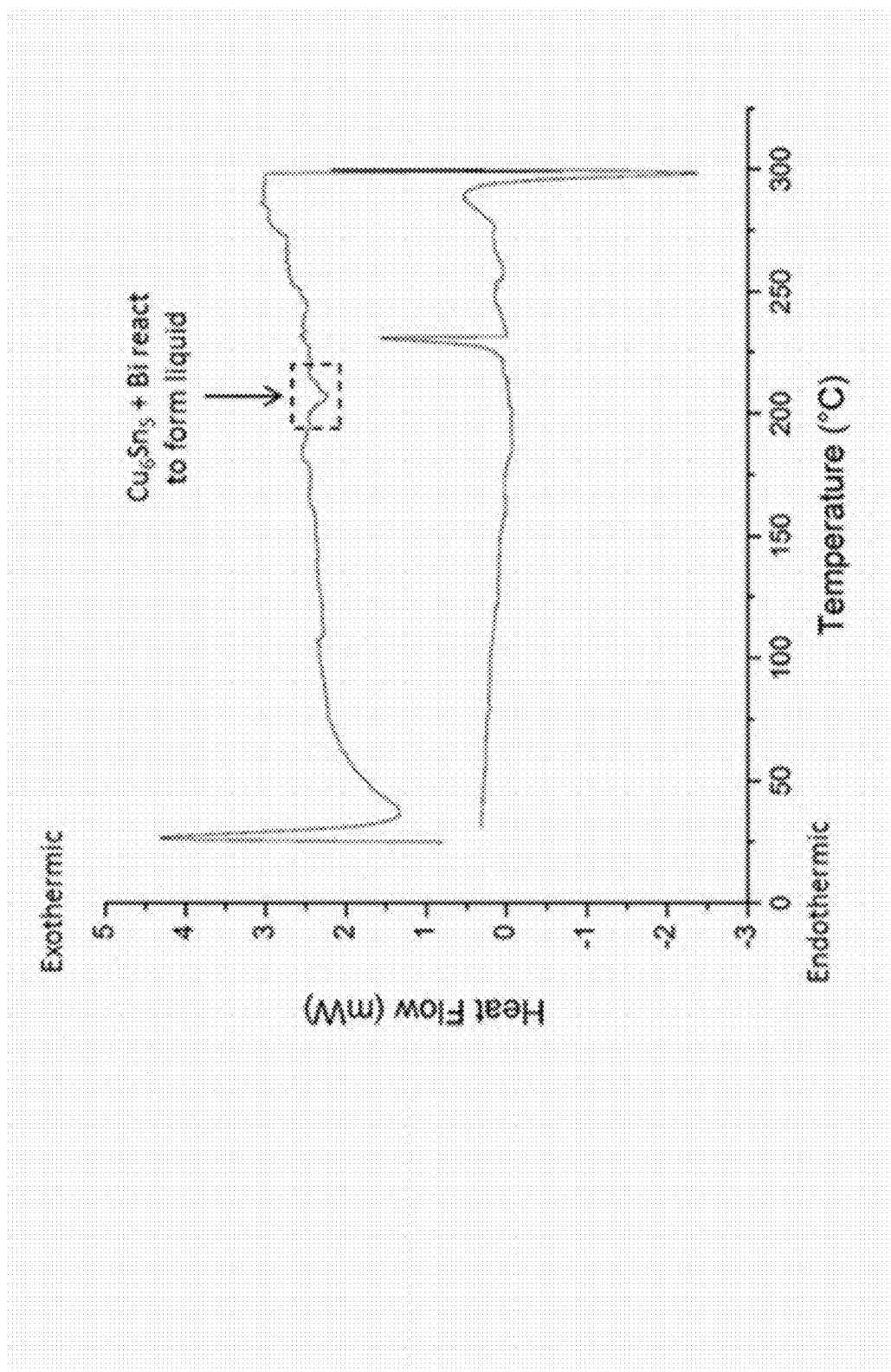
FIG. 14 is a plot showing DSC results from a Cu—Sn80 wt. % Bi—Cu assembly isothermally treated at 170° C. for 1 hour and cooled to room temperature. The DSC curve shown for subsequent heating of the assembly to 300° C., holding for 1 hour, and back to room temperature reveals a melting event near 200° C. on heating which is consistent with $Cu_6Sn_5$ reacting with the rejected Bi phase to form a liquid. The cooling curve shows only the resolidification of Bi.

The assemblies isothermally treated at 170° C. for one hour using the DSC did not exhibit a solidification peak during cooling from 170° C. to room temperature. This result indicates that all of the Sn—Bi liquid was converted to solid phases during the isothermal hold. During subsequent heating from room temperature to 300° C. the sample exhibited a melting event near 191° C. (FIG. 14) which indicates that $Cu_6Sn_5$ remained after the isothermal hold.

Figure 15:
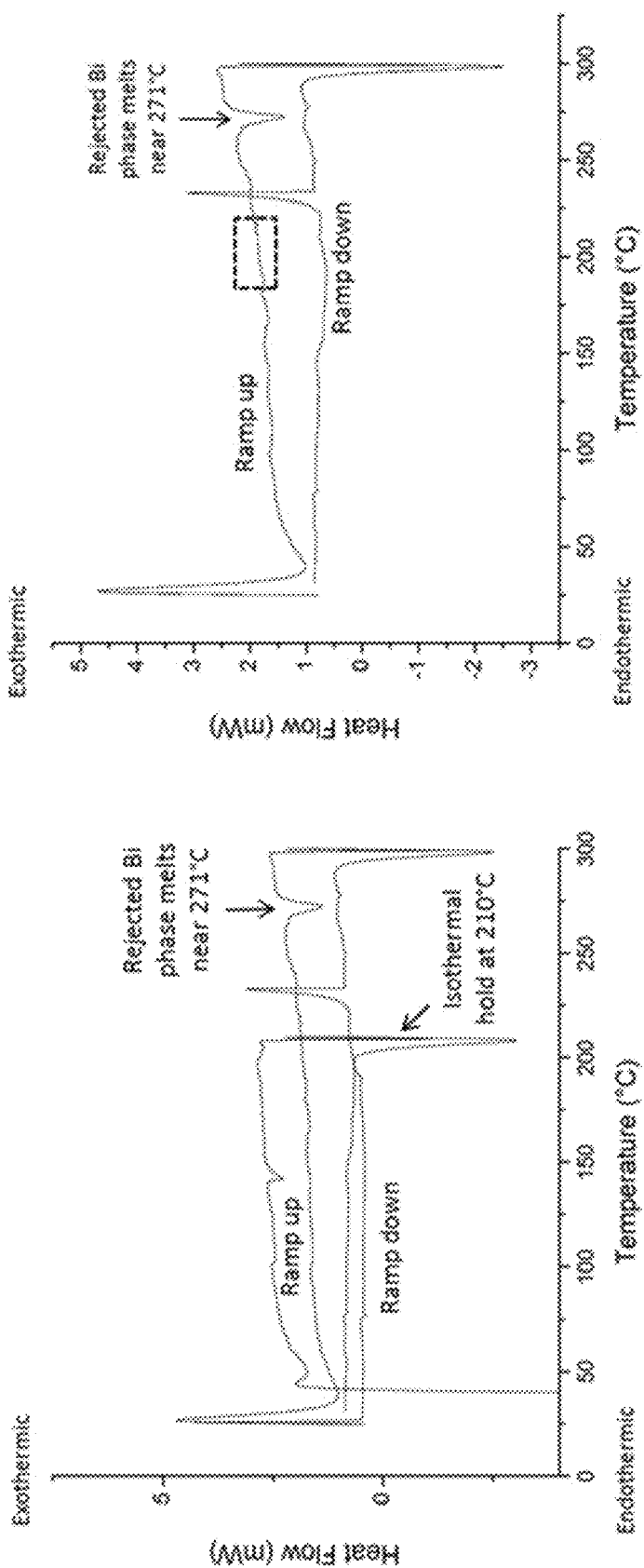
FIG. 15 shows DSC results from a Cu—Sn80 wt. % Bi—Cu assembly isothermally treated at 210° C. for 1 hour and subsequently heated to 300° C. and back to room temperature reveals a melting event near 271° C. which is consistent with the rejected Bi phase melting. Note the lack of melting activity near 200° C. indicates that $Cu_6Sn_5$ was not present.

The assemblies isothermally processed using the DSC at 210° C. and 260° C. both exhibited melting temperatures near 271° C. when heating to 300° C. for DSC after isothermal processing. The lack of a melting event near 200° C. (dashed box) for the 210° C. (FIG. 15) and 260° C. (not shown) runs indicated that the reaction of $Cu_6Sn_5$ and Bi to form liquid did not occur. Thus, the only IMC phase present was $Cu_3Sn$.

Figure 16:
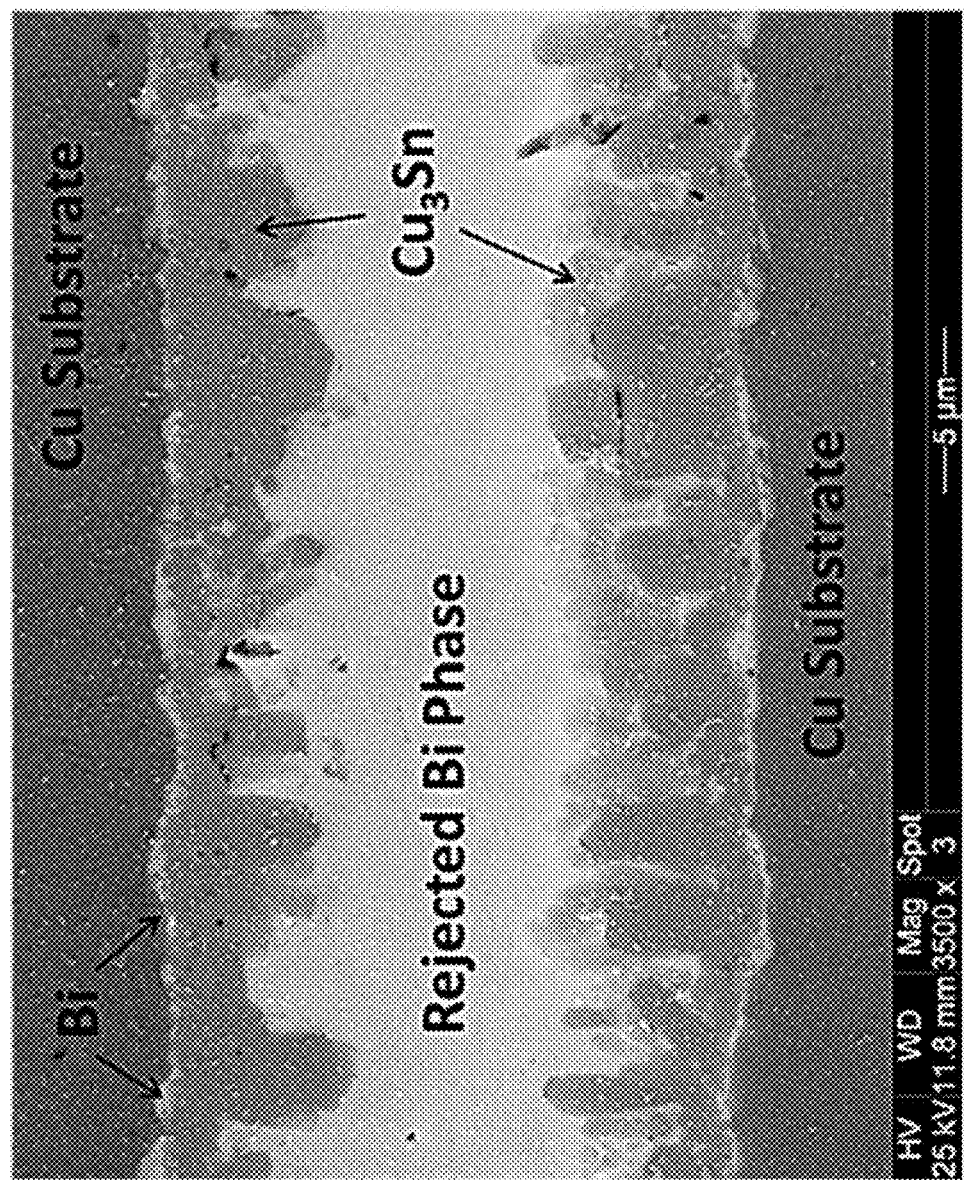
FIG. 16 is an SEM micrograph of a cross-section of a Cu—Sn80 wt. % Bi—Cu assembly isothermally processed at 210° C. and briefly heated to 300° C., and shows complete conversion of LTP to $Cu_3Sn$ and solid Bi.
Figure 17:
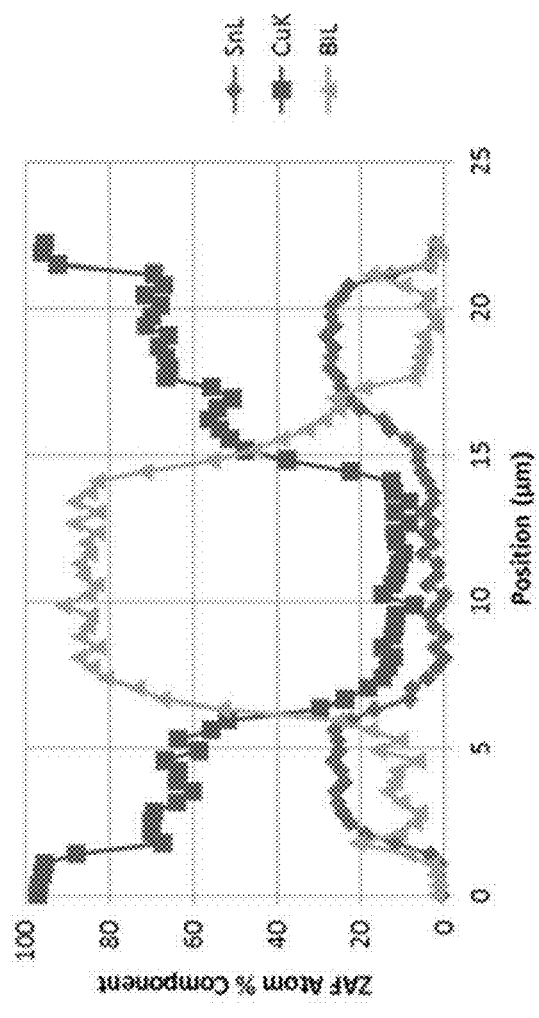
FIG. 17 is a plot of ZAF atom percent of each component versus position for an EDS line scan (right) and corresponding image (left), and shows that the lighter phase between $Cu_3Sn$ and the Cu substrate is Bi.

The Cu—(Sn—Bi)—Cu assemblies isothermally treated in the DSC were retained for microstructural analysis. Because all of the samples were heated to 300° C., complete conversion of the Sn—Bi liquid to Cu3Sn+Bi was observed in all of the assemblies. EDS was used to identify the phases as annotated in the figures. A representative microstructure presented in FIG. 16 illustrates that $Cu_3Sn$ formed at each interface with a rejected Bi phase forming along the center of the bondline. A Bi-rich phase also formed at the interface between $Cu_3Sn$ and the Cu substrates. The proposed mechanism is entrapment of Bi-rich liquid between the $Cu_3Sn$ grains during early growth of the IMC phase. Since the entrapped Bi layer is very fine, an EDS line scan was used to verify that the layer was in fact Bi. The results of the line scan shown in FIG. 17 exhibits an increase in Bi signal between the $Cu_3Sn$ and Cu interfaces.

The observed rate of growth of the $Cu_3Sn$ layer within Regime 3 deviated from that observed when $Cu_3Sn$ forms between a $Cu_6Sn_5$ layer and Cu in conventional Sn-rich systems. $Cu_3Sn$ growth was assessed using effectively infinite diffusion couples using the Sn80 wt. % Bi alloy at 210° C. and 260° C. for 20 and 60 minutes each. The thickness of the uniform $Cu_3Sn$ layer was measured from SEM micrographs of cross-sections of the solidified couples. Measurements indicated that at 260° C., $Cu_3Sn$ formed more rapidly than the $Cu_3Sn$ layer reported by previous studies. However, the overall IMC thickness was greater when forming both $Cu_6Sn_5$ and $Cu_3Sn$ concurrently.

Despite the slower rate of IMC formation observed in Bi-rich, Cu—Sn—Bi systems overall isothermal solidification may occur more quickly than pure Sn—Cu TLPB. Bi-rich, Cu—Sn—Bi TLPB has the advantage of requiring less overall IMC formation for complete isothermal solidification because there is less Sn present in the LTP. As an example, consider a 10 μm layer of Sn in contact with Cu versus a 10 μm layer of Sn80 wt. % Bi as illustrated in the schematic diagram in FIG. 18. Because the composition of Cu—Sn intermetallics are effectively a constant, layer thicknesses necessary for complete isothermal solidification may be calculated based on conservation of mass, the density of each phase, and the molar mass of each phase. Assuming constant area for planar bonding, the area will cancel out such that layer thickness ratios may be used. For Sn—Cu TLPB the ratio of thickness Sn consumed to $Cu_3Sn$ formed may be calculated as $$\frac{\left(118.69 \frac{g}{mol\,Sn}\right)}{3\left(63.546 \frac{g}{mol\,Cu}\right) + \left(118.69 \frac{g}{mol\,Sn}\right)} * \frac{8.97 \frac{g}{cm^3} Cu_3Sn}{7.36 \frac{g}{cm^3} Sn} = 0.468 \frac{Sn}{Cu_3Sn}$$

which means that 0.468 μm of the Sn layer thickness will be consumed by 1 μm of $Cu_3Sn$ formation. The same calculation may be performed for $Cu_6Sn_5$ as $$\frac{5\left(118.69 \frac{g}{mol\,Sn}\right)}{6\left(63.546 \frac{g}{mol\,Cu}\right) + 5\left(118.69 \frac{g}{mol\,Sn}\right)} * \frac{8.28 \frac{g}{cm^3} Cu_6Sn_5}{7.36 \frac{g}{cm^3} Sn} = 0.685 \frac{Sn}{Cu_6Sn_5}$$

which shows that 0.7 μm of Sn layer will be consumed by 1 μm of $Cu_6Sn_5$ formation. Continuing with the 10 μm reaction example, the pure Sn sample will thus require a minimum of 14.6 μm of $Cu_6Sn_5$. Forming the only $Cu_6Sn_5$ is a best case scenario for pure Sn TLPB for the purpose of comparison. For the Sn80 wt. % Bi sample the volume fraction of the Sn component may be approximated as $$\frac{\frac{20\,g}{7.36 \frac{g}{cm^3} Sn}}{\left(80 * 9.78 \frac{g}{cm^3} Bi + 20 * 7.36 \frac{g}{cm^3} Sn\right)} = 0.158 \frac{Sn}{Sn80Bi}$$

Figure 18:
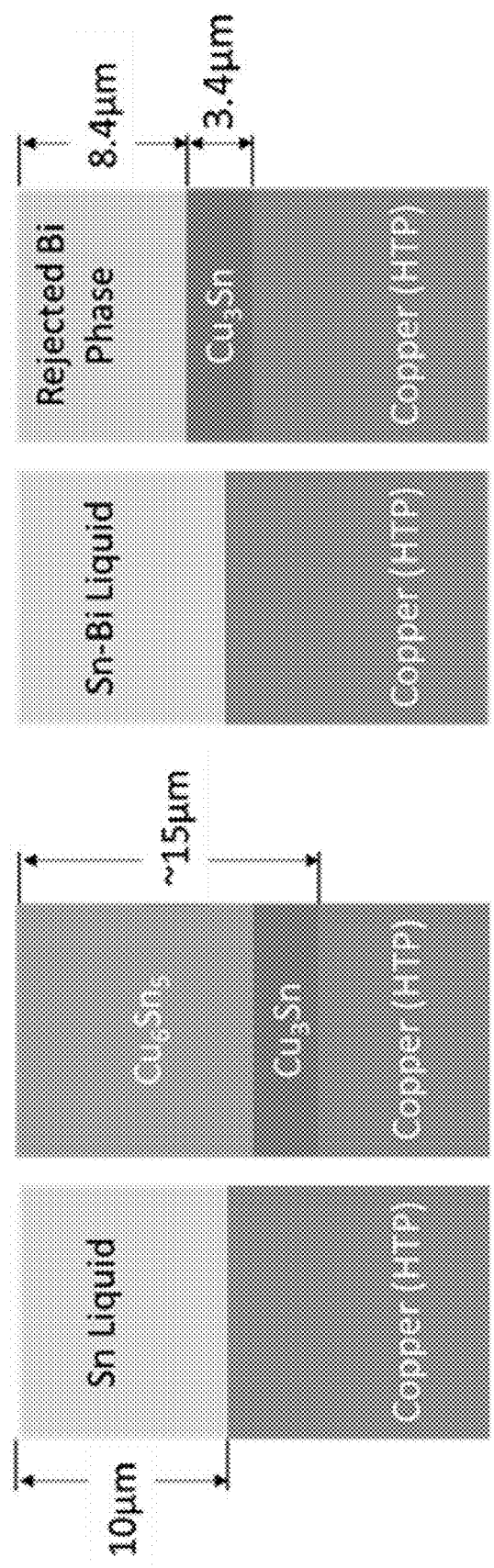
FIG. 18 is a schematic comparing the isothermal solidification behavior of pure Sn to that of a Sn80 wt. % Bi alloy in contact with pure Cu, and illustrates that significantly more IMC must form for complete isothermal solidification of pure Sn based on conservation of mass.

Therefore one may consider the effective Sn height for the 10 μm layer to 1.58 μm. Dividing the 1.58 μm effective Sn layer by the Sn to $Cu_3Sn$ ratio yields a result of 3.4 μm of $Cu_3Sn$ needed to consume all of the Sn from a 10 μm layer of Sn80 wt. % Bi. The thickness of the rejected Bi layer is simply 1-0.158 since Bi is the only remaining component. The results of this example are illustrated in FIG. 18. This result illustrates the advantage of Bi-rich TLPB. Since IMC formation is the rate limiting step for isothermal solidification in TLPB, a Bi-rich system with the same initial bondline will solidify more rapidly.

Figure 19:
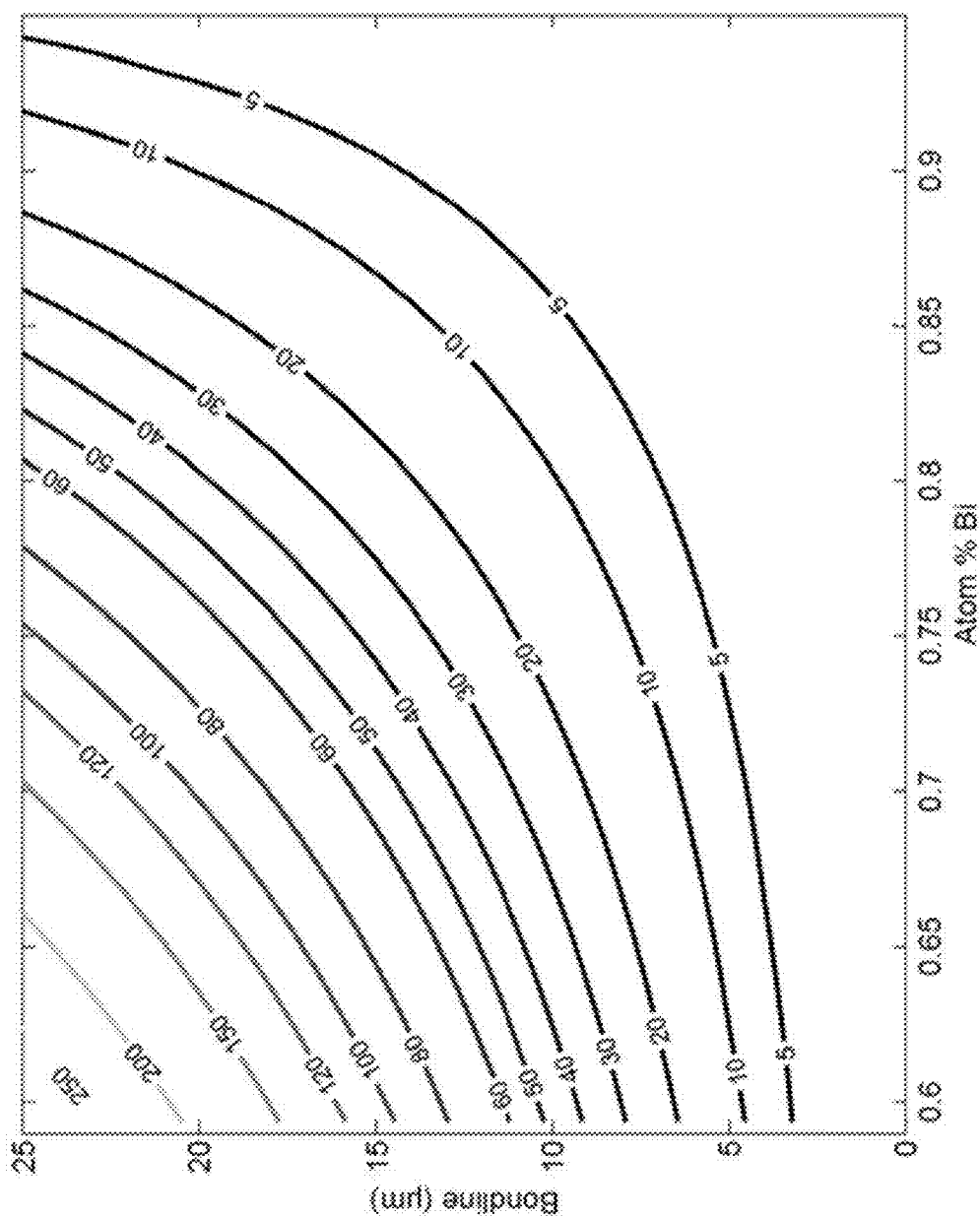
FIG. 19 is a contour map illustrating the minimum processing time (minutes) at 235° C. for a given initial bondline and LTP.

The advantages of a Bi-rich, Sn—Bi LTP are further illustrated by the processing map shown in FIG. 19. Minimum process time is plotted as a contour map as a function of Bi content and bondline. Minimum process time is calculated using the growth constant, 0.0681 $\mu m/s^{1/2}$. An effective bondline was computed by conservation of mass. The initial bondline was divided by the volume Sn consumed per volume IMC formed (calculated above) to establish the necessary IMC layer to consume all of the Sn.

Figure 20:
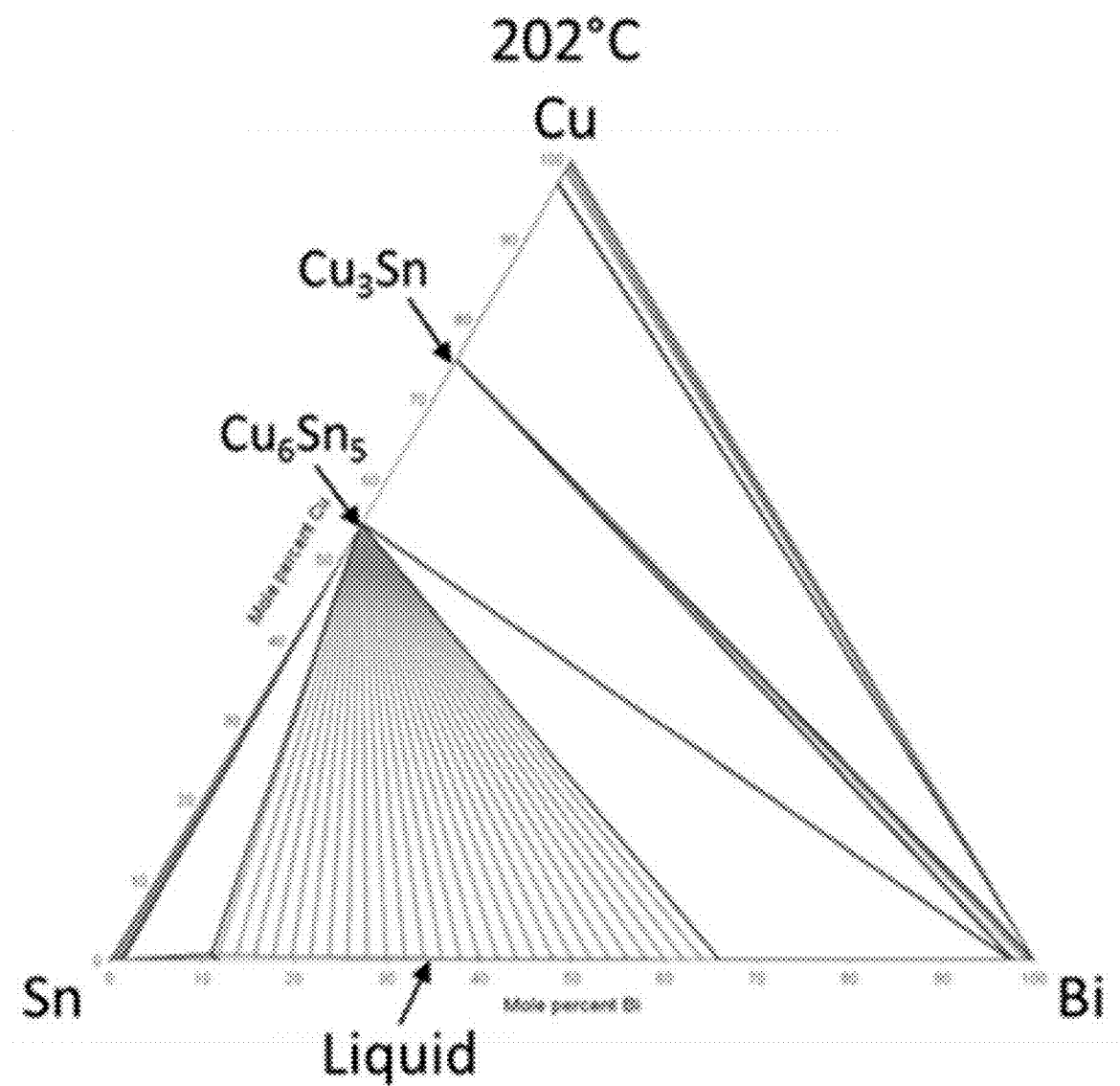
FIGS. 20 and 21 contain ternary phase diagrams showing the isothermal sections of the Cu—Sn—Bi phase diagram at 202° C. and 203°, respectively.
Figure 21:
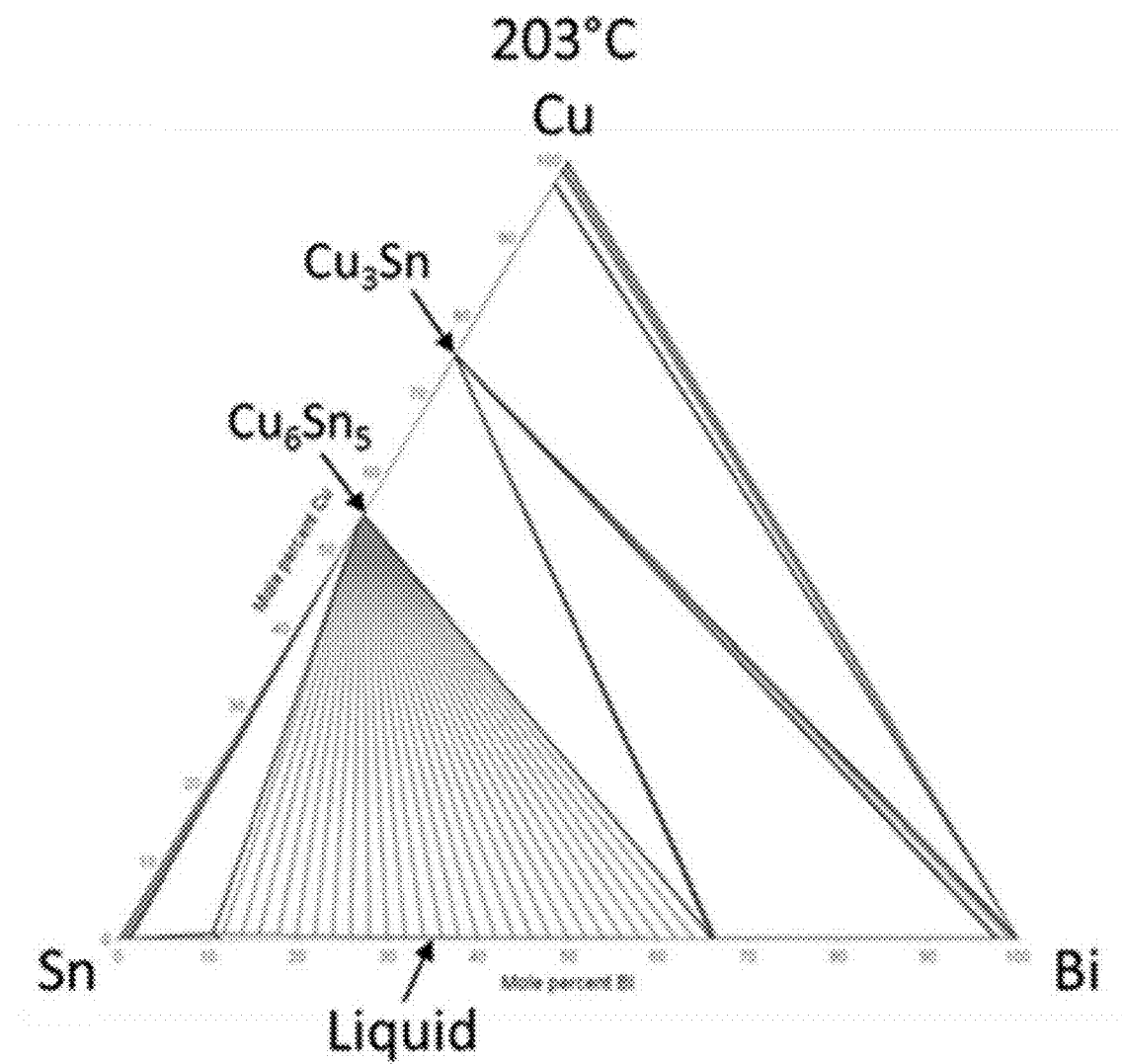

FIGS. 20 and 21 show the isothermal sections of the Cu—Sn—Bi phase diagram at 202° C. and 203°, respectively, and demonstrate that the transition from three phase equilibrium linking the terminal liquid composition, $Cu_6Sn_5$, and solid Bi to the terminal liquid phase being in three phase equilibrium with $Cu_6Sn_5$ and $Cu_3Sn$. This transition results in the formation of liquid at the interface between solid Bi and $Cu_6Sn_5$ when heated above 203° C. The resulting bonds/joints exhibited shear strengths using lap shear measurements of greater than 9 MPa, as limited by the load cell used for the experiments.

In view of the above, a process is disclosed for joining two (or more) substrates via TLPB. The process includes providing an interlayer of a LTP between and in contact with the substrates. The LTP includes Sn and Bi, and may optionally be a binary Sn—Bi alloy. The substrates and the interlayer therebetween are heated at a processing temperature equal to or above 200° C. such that the LTP interacts with HTPs of the substrates to yield isothermal solidification of the interlayer. If the HTPs are formed of or include Cu, the processing temperature is maintained for a duration sufficient for the interlayer to be completely consumed such that a solid bond is formed between the substrates. The concentration of Bi in the LTP is sufficiently high relative to the processing temperature such that $Cu_6Sn_5$ is not formed during the heating step. Such concentrations relative to processing temperature are represented in FIG. 1.

Although the above disclosure focused on exemplary binary Sn—Bi alloys as the LTP, it is within the scope of the invention that the interlayer composition may include additional alloying elements which may change the properties of the resulting bond formed between two Cu substrates as long as these additional elements do not lead to the formation of $Cu_6Sn_5$ or any other phase or combination of phases during isothermal solidification that form a low temperature liquid with solid Bi or otherwise form a liquid when the bond is heated above the processing temperature (e.g., above 200° C.) but below the melting temperature of Bi. These additional alloying elements may include, but are not limited to, Ag, Cu, Ni, Pb, In, Sb, Ga, Ge, and Si.

It is within the scope of the invention that the interlayer composition may be in provided in various initial forms including but not limited to particles suspended in a paste, a foil, a preform, an electrodeposited film, or a wire. As another example, the LTP may be formed of a powder comprising particles having a core-shell formulation including a shell formed of Sn that encapsulated an inner core formed of Bi. In such configuration, the TLPB may not cause complete melting of the Bi core. This may be advantageous in certain applications such as for developing multiple Bi grain orientations in the resulting bonds/joints/interconnects. Another nonlimiting configuration includes providing the LTP as a composite paste with HTP metal particles (e.g., Cu, Ag, Ni, mixtures thereof, and/or binary and/or ternary alloys thereof). Such alternative configurations are within the skill of those in the art and therefore will not be discussed further herein.

As noted previously, the HTP of the substrates may be an element other than Cu. In the instance of Sn—Bi—Ni and Sn—Bi—Ag systems, using Bi-rich Sn—Bi alloys with Ag and Ni substrates also has distinct advantages over lower Bi containing alloys. Precipitation of Bi during intermetallic formation means that the time for the complete isothermal solidification reaction is significantly less than for high Sn alloys, since precipitation forms a solid phase. In addition to the shorter times required for isothermal solidification of high Bi alloys, the required minimum thicknesses of the Ni or Ag layers on the substrates will be significantly less than for high Sn Sn—Bi alloys of the same interlayer thickness.

As an example of the implementation of the herein described processes and compositions, one example application involves a drop-in replacement for high Pb solder alloys being currently used in electronics. Certain jurisdictions, for example the European Union (EU), have banned the use of Pb in electronics, particularly for solder, but has continued to issue an exemption for high-Pb solders because there were previously no drop-in replacements. The industry and the EU continue to search for replacements. If the disclosed methods and compositions are implemented, the exemption could potentially be removed and there would be an immediate market for its use. In addition, as automotive electronics require higher and higher temperatures for bonding materials, this technology could find an application in under-hood power electronics.

As such, TLPB compositions are suitable replacements for conventional electrically and/or thermally conductive materials in a diverse assortment of applications, including assembly of electronic components, deposition of in-plane circuit traces, interconnection of circuit traces on different planes, assembly of unpackaged integrated circuit die onto packaging elements, die attach, heatsink attachment, and the like. For each of these applications, there is a specific set of application-specific attributes for which TLPB compositions confer an advantage over conventional materials. Attributes include, but are not limited to, ease of deposition, reduction in manufacturing time or complexity, increased circuit density in the resultant article, and production of environmentally stable interfaces that have high electrical and/or thermal conductivity.

While the invention has been described in terms of specific or particular embodiments and investigations, it should be apparent that alternatives could be adopted by one skilled in the art. For example, the substrates could have various shapes and sizes depending on the application, various materials could be used in the fabrication of the substrates, interlayer compositions, and resulting bonds and process parameters such as temperatures and durations could be modified. Accordingly, it should be understood that the invention is not necessarily limited to any embodiment described herein or illustrated in the drawings. It should also be understood that the phraseology and terminology employed above are for the purpose of describing the disclosed embodiments and investigations, and do not necessarily serve as limitations to the scope of the invention. Therefore, the scope of the invention is to be limited only by the following claims.

The invention claimed is:

1. A process of joining first and second substrates via transient liquid phase bonding (TLPB), the process comprising:

providing an interlayer of a low melting temperature phase (LTP) between and in contact with first and second substrates that contain high melting temperature phases (HTPs), the LTP comprising Sn and Bi and the interlayer comprising particles having a core formed of Bi encapsulated in a shell formed of Sn; and heating the first and second substrates and the interlayer therebetween at a processing temperature equal to or above 200° C. such that the interlayer liquefies but does not cause complete melting of the cores thereof, and the LTP thereof interacts with the HTPs of the first and second substrates to yield isothermal solidification of the interlayer, wherein the processing temperature is maintained for a duration sufficient for the liquefied interlayer to be completely consumed and a solid bond is formed between the first and second substrates.

2. The process of claim 1, wherein the HTPs contain Ag, Cu, Ni, or a combination thereof.

3. The process of claim 1, wherein the HTPs contain Cu and the LTP interacts with the HTPs during the heating step to form one or more intermetallic phases that do not include $Cu_6Sn_5$.

4. The process of claim 1, wherein the HTPs include Cu and the concentration of Bi in the LTP composition is sufficiently high relative to the processing temperature such that $Cu_6Sn_5$ is not formed during the heating step.

5. The process of claim 4, wherein the processing temperature is between 200 and 300° C. and the LTP includes at least 54 wt. % Bi.

6. The process of claim 1, wherein the HTPs contain Cu and the LTP is a binary alloy consisting of Sn and Bi, wherein the LTP interacts with the HTPs during the heating step to form only $Cu_3Sn$ accompanied by Bi precipitation.

7. The process of claim 1, wherein the solid bond remains solid when heated above 200° C.

8. The process of claim 1, wherein the solid bond remains solid when heated up to 260° C.

9. The process of claim 1, wherein the LTP further comprises one or more of Ag, Cu, Ni, Pb, In, Sb, Ga, Ge, or Si, the HTP compositions contain Cu, the only intermetallic compound formed by the heating step at the interface between the interlayer and the first and second substrates is $Cu_3Sn$, and the solid bond remains solid when heated to temperatures between 200° C. and the melting temperature of Bi.

10. The process of claim 1, wherein the interlayer is in the form of particles suspended in a paste, a foil, a preform, an electrodeposited film, or a wire.

11. A process of joining substrates via transient liquid phase bonding (TLPB), the process comprising:

providing an interlayer of a low melting temperature phase (LTP) between and in contact with the substrates that contain high melting temperature phases (HTPs), the LTP comprising Sn and Bi and the interlayer comprising particles having a core formed of Bi encapsulated in a shell formed of Sn; and heating the substrates and the interlayer therebetween at a processing temperature equal to or above 200° C. such that the interlayer liquefies but does not cause complete melting of the cores thereof, and the LTP thereof interacts with the HTPs of the substrates to yield isothermal solidification of the interlayer, the HTPs comprising Cu, wherein the processing temperature is maintained for a duration sufficient for the liquefied interlayer to be completely consumed by intermetallic formation, interdiffusion, and precipitation of Bi and a solid bond is formed between the substrates, wherein the concentration of Bi in the LTP is sufficiently high relative to the processing temperature such that $Cu_6Sn_5$ will not form when heated to or above 200° C.

12. The process of claim 11, wherein the processing temperature is between 200 and 300° C. and the LTP includes at least 54 wt. % Bi.

13. The process of claim 11, wherein the LTP contains at least 65 wt. % Bi.

14. The process of claim 11, wherein the LTP is a binary alloy consisting of Sn and Bi.

15. The process of claim 14, wherein the LTP interacts with the HTPs during the heating step to form only $Cu_3Sn$ accompanied by Bi precipitation.

16. The process of claim 1, wherein the solid bond remains solid when heated above 200° C.

17. The process of claim 1, wherein the solid bond remains solid when heated up to 260° C.

* * * * *